United States Patent
Masaaki

(10) Patent No.: US 8,440,954 B2
(45) Date of Patent: May 14, 2013

(54) SOLID-STATE IMAGE PICKUP DEVICE WITH A WIRING BECOMING A LIGHT RECEIVING SURFACE, METHOD OF MANUFACTURING THE SAME, AND ELECTRONIC APPARATUS

(75) Inventor: Bairo Masaaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 332 days.

(21) Appl. No.: 12/958,004

(22) Filed: Dec. 1, 2010

(65) Prior Publication Data

US 2011/0139962 A1 Jun. 16, 2011

(30) Foreign Application Priority Data

Dec. 16, 2009 (JP) .................................. 2009-285351

(51) Int. Cl.
*H01L 27/00* (2006.01)
(52) U.S. Cl.
USPC .................................... 250/208.1; 250/214 R
(58) Field of Classification Search ................ 250/208.1, 250/214 R, 239; 257/290–294, 432–435, 257/440; 438/59–73
See application file for complete search history.

(56) References Cited

U.S. PATENT DOCUMENTS 7,728,301 B2 * 6/2010 Atsuta et al. ............. 250/370.09

FOREIGN PATENT DOCUMENTS

| JP | 62-206873 | 9/1987 |
| JP | 2002-151673 | 5/2002 |
| JP | 2003-031785 | 1/2003 |

* cited by examiner

*Primary Examiner* — Que T Le
(74) *Attorney, Agent, or Firm* — Dentons US LLP

(57) ABSTRACT

Disclosed herein is a solid-state image pickup device, including: a plurality of pixels each composed of a photoelectric conversion element formed in a semiconductor substrate for generating and accumulating signal electric charges corresponding to a light quantity of incident light, and an electric charge reading portion formed on a front surface side of the semiconductor substrate for reading out the signal electric charges generated and accumulated in the photoelectric conversion element; a wiring for a substrate potential formed on a back surface side, becoming a light receiving surface, of the semiconductor substrate for supplying a desired voltage to the semiconductor substrate; and a back surface side contact portion through which the wiring for a substrate potential and the semiconductor substrate are electrically connected to each other.

15 Claims, 18 Drawing Sheets

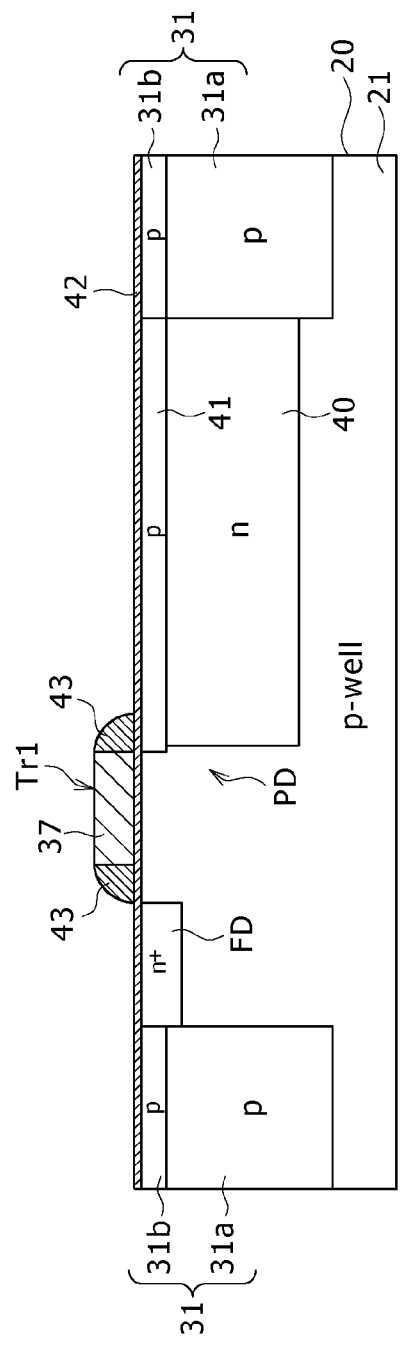
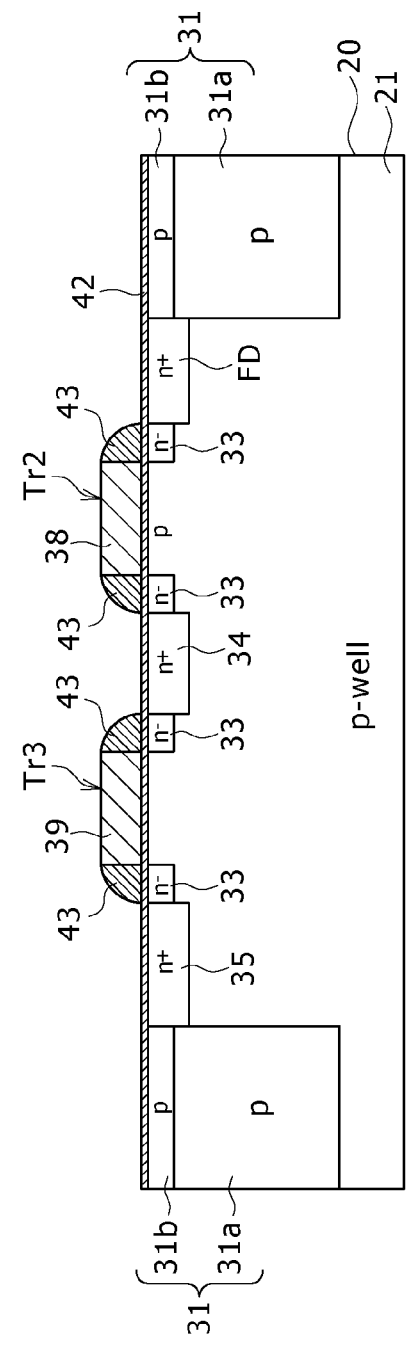
FIG. 3A
FIG. 3B

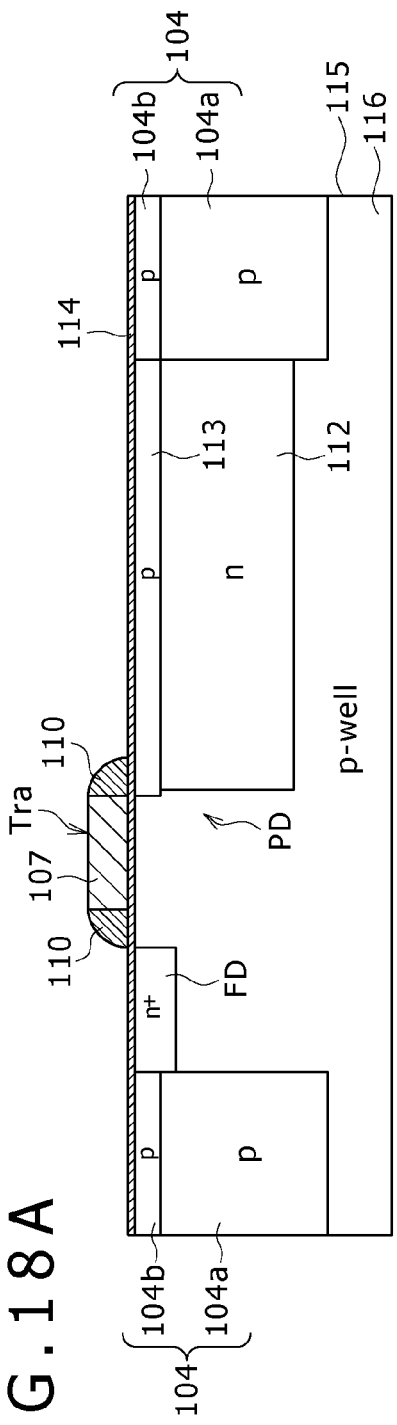
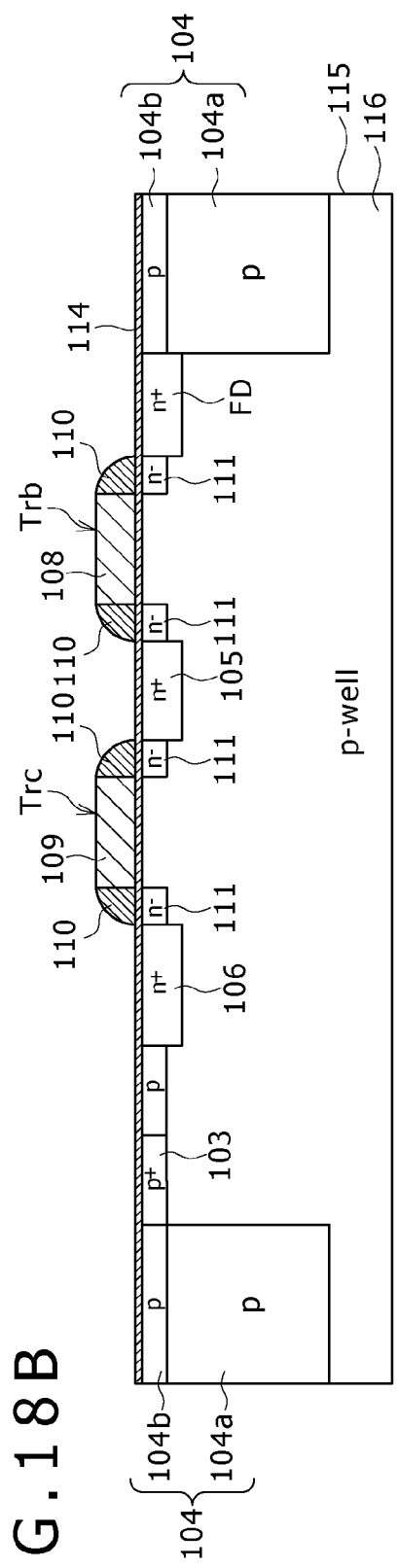
FIG.18A A-A CROSS SECTION
FIG.18B B-B CROSS SECTION

SOLID-STATE IMAGE PICKUP DEVICE WITH A WIRING BECOMING A LIGHT RECEIVING SURFACE, METHOD OF MANUFACTURING THE SAME, AND ELECTRONIC APPARATUS

BACKGROUND OF THE INVENTION

1. Field of the Invention

The present invention relates to a solid-state image pickup device, such as a complementary metal oxide semiconductor (CMOS) image sensor or a charge coupled device (CCD) image sensor, including a photoelectric conversion portion having a plurality of pixels disposed therein. In particularly, the present invention relates to a back surface radiation type solid-state image pickup device in which a signal circuit is formed on one surface of a substrate, and a light is received through the other surface of the substrate, and a method of manufacturing the same. In addition, the invention relates to an electronic apparatus using the same.

2. Description of the Related Art

In recent years, a video camera and a mobile phone with a camera have been in wide spread use. A CCD type or CMOS type solid-state image pickup device is used in these cameras.

With regard to such a solid-state image pickup device, in recent years, a back surface radiation type solid-state image pickup device has been known which is structured in such a way that a wiring layer is formed on a front surface side of a semiconductor layer, and a light is made incident from a back surface side of the semiconductor layer to be adapted to capture an image of a subject. This technique has such a merit that a quantity of received light can be increased without receiving an influence of attenuation, kicking or the like of a light because there is no signal wiring made of Cu or the like on a light receiving surface side. Also, this technique also has such a merit that it is possible to prevent a part of the kicked light from being made incident to an adjacent pixel to provide color mixture. With regard to the back surface radiation type solid-state image pickup device, CCD type one and CMOS type one are proposed. This, for example, is described in Japanese Patent Laid-Open Nos 2002-151673 and 2003-31785.

The back surface radiation type MOS solid-state image pickup device (CMOS image sensor) is composed of a pixel area including a pixel array, and a peripheral area. In this case, the pixel array is structured by two-dimensionally disposing a plurality of pixels in one semiconductor chip. Also, the peripheral area is disposed outside the pixel area so as to include active elements and passive elements. In addition, the MOS type solid-state image pickup device includes various kinds of transistors such as a transferring transistor and an amplifying transistor every unit pixel composing the pixel array. In the MOS type solid-state image pickup device, a light which is made incident from the back surface side to each of the pixels is subjected to photoelectric conversion by a photodiode to generate signal electric charges, and these signal electric charges are transferred to a floating capacitance layer (floating diffusion) by the transferring transistor. Also, the signal electric charges thus transferred are converted into an electric signal by the floating diffusion and are then amplified by the amplifying transistor, thereby outputting signals from the respective pixels to a peripheral circuit portion.

FIG. 17 shows a layout diagram of a unit pixel cell (hereinafter referred to as "a unit pixel") 100 in the pixel area composing an existing CMOS image sensor. The unit pixel 100 is composed of a photodiode PD serving as a photoelectric conversion element, a transferring transistor Tra, a resetting transistor Trb, an amplifying transistor Trc, a floating diffusion FD, and a well electrode 103 through which a voltage is applied to a pixel well. Also, in the existing solid-state image pickup device, the unit pixels 100 are two-dimensionally disposed within the pixel well, thereby structuring the pixel array. In addition, each adjacent two unit pixels 100 are electrically separated from each other through PN junction isolation by an isolation region 104.

Cross sectional views of this unit pixel 100 are respectively shown in FIGS. 18A and 18B. FIG. 18A is a cross sectional view taken on line A-A of FIG. 17, and FIG. 18B is a cross sectional view taken on line B-B of FIG. 17. The unit pixel 100 is disposed in a pixel well region composed of a p-type impurity region 116. In this case, a conductivity type of a predetermined region, within a semiconductor substrate 115 made of n-type silicon extending from a front surface side to a back surface side is converted from the n-type into the p-type, thereby forming the p-type pixel well region 116. The photodiode PD is composed of an n-type semiconductor region 112 formed in the p-type pixel well region 116, and a p-type semiconductor region 113 formed on the n-type semiconductor region 112. The transferring transistor Tra is composed of the n-type semiconductor region 112 of the photodiode PD, and an $n^+$-type floating diffusion FD serving as an impurity region having an impurity concentration higher than that of the n-type semiconductor region 112, and a transfer gate electrode 107 formed on the semiconductor substrate 115 through a gate insulating film 114. In addition, the transfer gate electrode 107 is made of $n^+$-type polysilicon.

In addition, as shown in FIG. 18B, the resetting transistor Trb is composed of a source/drain region 105 composed of an $n^+$-type region within the pixel well region 116, and a gate electrode 108 made of $n^+$-type polysilicon and formed on the semiconductor substrate 115 through the gate insulating film 114. At this time, the source region of the resetting transistor Trb, and the floating diffusion FD are made the same region.

The amplifying transistor Trc is composed of a source/drain region 105, 106 composed of an $n^+$-type region within the p-type pixel well region 116, and a gate electrode 109 made of $n^+$-type polysilicon and formed on the semiconductor substrate 115 through the gate insulating film 114 similarly to the case of the resetting transistor Trb.

In addition, a sidewall 110, for example, made from a silicon oxide film is formed on each of sidewalls of the transfer gate electrodes 107, 108 and 109. Also, an offset region 111 composed of an $n^+$-type region is formed right below each of the sidewalls 110 of the amplifying transistor Trc and the resetting transistor Trb.

In addition, the isolation region 104 for isolating each adjacent two unit pixels 100 is composed of an isolation region layer 104a composed of a p-type semiconductor region, and a p-type channel stopper layer 104b formed on a surface side of the isolation region layer 104a.

Also, a well electrode 103 composed of a $p^+$-type region is formed in a desired region on the surface side of the semiconductor substrate 115.

FIG. 19 shows a schematic cross sectional structure of the existing back surface radiation type solid-state image pickup device composed of the unit pixels 100 each having the structure described above. In FIG. 19, the unit pixel 100 shown in FIG. 17 is illustrated as the pixel 100, and illustrations of the structures of the pixel transistor and the like are omitted here. That is to say, the pixel 100 is provided with the photodiode PD, the pixel transistors (the transferring transistor Tra, the resetting transistor Trb and the amplifying transistor Trc), the floating diffusion FD, and the well electrode 103 which have been all described.

Metallic wirings 122 of three layers are formed within an interlayer insulating film 121 made of a silicon oxide and formed on one surface side (on a front surface side of the semiconductor substrate 115) of the semiconductor substrate 115 having the pixel area formed thereon. A light blocking film 125, made of a metal, for light-blocking between each adjacent two pixels 100 is formed within an interlayer insulating film 124 made of a silicon oxide, and is formed on the other surface side (on the back surface side of the semiconductor substrate 115) of the semiconductor substrate 115 to which a light is made incident. In the light blocking film 125, each of positions corresponding to the photodiodes PD within the pixels 100, respectively, is opened. In addition thereto, a color filter 126 and on-chip lenses 127 are formed on the surface of the interlayer insulating film 124 in order.

Also, in such a back surface radiation type solid-state image pickup device, the metallic wiring 122 formed on the front surface side of the semiconductor substrate 115 is connected to the well electrode 103 formed on the semiconductor substrate 115 through a well contact, and a reference potential such as GND is supplied to the metallic wiring 122. As a result, a potential of the pixel well region 116 composed of the p-type semiconductor region is fixed to a given level.

Japanese Patent Laid-Open No. Sho 62-206873 discloses a structure on which the $p^+$-type well electrode 103 for fixing the well potential of the pixel area to the reference potential such as GND is formed every unit pixel 100 as described with reference to FIGS. 18A and 18B. However, when the well electrode 103 for fixing the potential of the well region 116 is disposed every unit pixel 100, an area necessary for the disposition of the well electrode 103 is required every unit pixel 100. As a result, an area of the photodiode, and gate areas of the pixel transistors such as the amplifying transistor Trc need to be reduced all the more. In this case, there is encountered such a problem that the reduction in area of the photodiode PD causes reduction of a saturated signal level of the photodiode PD, and the reduction in gate areas of the pixel transistors increases a random noise such as a flicker noise generated from the pixel transistors.

For this reason, for example, as shown in FIG. 20, there is also expected a structure in which well contacts 118 are formed only in a peripheral portion of a pixel area 119. However, with the structure shown in FIG. 20, for the pixel 100 close to the well contact 118 as shown in an area I, and the pixel 100 located away from the well contact 118 as shown in an area II, it is difficult to hold the potential of the pixel well area 116 constant. As a result, there are caused such a problem that threshold values of the pixel transistors fluctuate among the pixels, and such a problem that a coupling capacitance between the isolation region 104 and the metallic wirings 122 fluctuates in the pixel area 119. As a result, the pixel characteristics are deteriorated.

It is noted that although in the above related art, the description has been given by exemplifying the solid-state image pickup device in which the MOS type p-type pixel well region is formed within the n-type semiconductor substrate, and the unit pixels are formed within the p-type pixel well region, the same problem as that described above is caused even in the case of a MOS type solid-state image pickup device in which the conductivity type of the impurity is opposite to that of the impurity in the related art.

In addition thereto, the problem in the above related art has been described by exemplifying the MOS type solid-state image pickup device. In this case, however, the CCD type solid-state image pickup device also involves the same problem that the well electrode is provided within the unit pixel, whereby it may be impossible to increase the area of the photodiode.

SUMMARY OF THE INVENTION

The present invention has been made in order to solve the problems described above, and it is therefore desirable to provide a solid-state image pickup device, as a back surface radiation type solid-state image pickup device, in which a potential of a substrate having pixels formed therein can be held constant and pixel characteristics such as an amount of saturated signal and a random noise are improved without reducing an area of each of a photoelectric conversion element and the like in each of the pixels and a method of manufacturing the same, and an electronic apparatus using the same.

In order to attain the desire described above, according to an embodiment of the present invention, there is provided a solid-state image pickup device including: a plurality of pixels each composed of a photoelectric conversion element formed in a semiconductor substrate for generating and accumulating signal electric charges corresponding to a light quantity of incident light, and an electric charge reading portion formed on a front surface side of the semiconductor substrate for reading out the signal electric charges generated and accumulated in the photoelectric conversion element; a wiring for a substrate potential formed on a back surface side, becoming a light receiving surface, of the semiconductor substrate for supplying a desired voltage to the semiconductor substrate; and a back surface side contact portion through which the wiring for a substrate potential and the semiconductor substrate are electrically connected to each other.

In the solid-state image pickup device according to the embodiment of the present invention, the wiring for a substrate potential, and the semiconductor substrate are electrically connected to each other through the back surface side contact portion. Therefore, the potential of the semiconductor substrate having the pixels formed therein is held contact by the voltage supplied from the wiring for a substrate potential. In addition, the wiring for a substrate potential is formed on the back surface side of the semiconductor substrate as a side opposite to the side on which the electric charge reading portion of the semiconductor substrate is formed. Therefore, the potential of the semiconductor substrate can be fixed without reducing the area of each of the elements such as the photoelectric conversion element composing the pixel.

According to further embodiment of the present invention, there is provided a method of manufacturing a solid-state image pickup device including the steps of: forming a plurality of pixels each composed of a photoelectric conversion element formed in a semiconductor substrate for generating and accumulating signal electric charges corresponding to a light quantity of incident light, and an electric charge reading portion formed on a front surface side of the semiconductor substrate for reading out the signal electric charges generated and accumulated in the photoelectric conversion element; forming a back surface side interlayer insulating film on a back surface side, becoming a light receiving surface, of the semiconductor substrate; forming a contact hole in the back surface side interlayer insulating film, and forming a back surface side contact portion by filling a desired metallic material in the contact hole; and forming a metallic film over an upper portion of the back surface side interlayer insulating film including the back surface side contact portion, and forming a wiring for a substrate potential electrically connected to the semiconductor substrate by patterning the metallic film into a desired shape, a desired voltage being applied to the semiconductor substrate through the wiring for a substrate potential.

With the method of manufacturing a solid-state image pickup device according to the further embodiment of the present invention, it is possible to readily obtain the solid-state image pickup device in which the wiring for a substrate potential, and the semiconductor substrate are electrically connected to each other through the back surface side contact portion, and the potential of the semiconductor substrate having the pixels formed therein is held constant by the voltage supplied from the wiring for a substrate potential.

According to still further embodiment of the present invention, there is provided an electronic apparatus including: an optical lens; a solid-state image pickup device to which a light condensed by the optical lens is made incident, the solid-state image pickup device including a plurality of pixels each composed of a photoelectric conversion element formed in a semiconductor substrate for generating and accumulating signal electric charges corresponding to a light quantity of incident light, and an electric charge reading portion formed on a front surface side of the semiconductor substrate for reading out the signal electric charges generated and accumulated in the photoelectric conversion element, a wiring for a substrate potential formed on a back surface side, becoming a light receiving surface, of the semiconductor substrate for supplying a desired voltage to the semiconductor substrate, and a back surface side contact portion through which the wiring for a substrate potential and the semiconductor substrate are electrically connected to each other; and a signal processing circuit for processing an output signal from the solid-state image pickup device.

According to the embodiment of the present invention, it is possible to obtain the solid-state image pickup device in which the potential of the substrate having the pixels formed therein can be held constant and the pixel characteristics such as the amount of saturated signal and the random noise are improved without reducing the area of each of the photoelectric conversion element and the like in each of the pixels and the method of manufacturing the same, and the electronic apparatus using the same.

BRIEF DESCRIPTION OF THE DRAWINGS

FIGS. 3A and 3B are respectively a cross sectional view taken on line A-A of FIG. 2, and a cross sectional view taken on line B-B of FIG. 2;

FIGS. 18A and 18B are respectively a cross sectional view taken on line A-A of FIG. 17, and a cross sectional view taken on line B-B of FIG. 17;

DETAILED DESCRIPTION OF THE PREFERRED EMBODIMENTS

Hereinafter, a CMOS type solid-state image pickup device and a method of manufacturing the same, and an electronic apparatus using the same according to embodiments of the present invention will be described in detail with reference to FIGS. 1 to 16. The embodiments of the present invention will be described in accordance with the following description. It is noted that the present invention is by no means limited to the embodiments.

Figure 1:
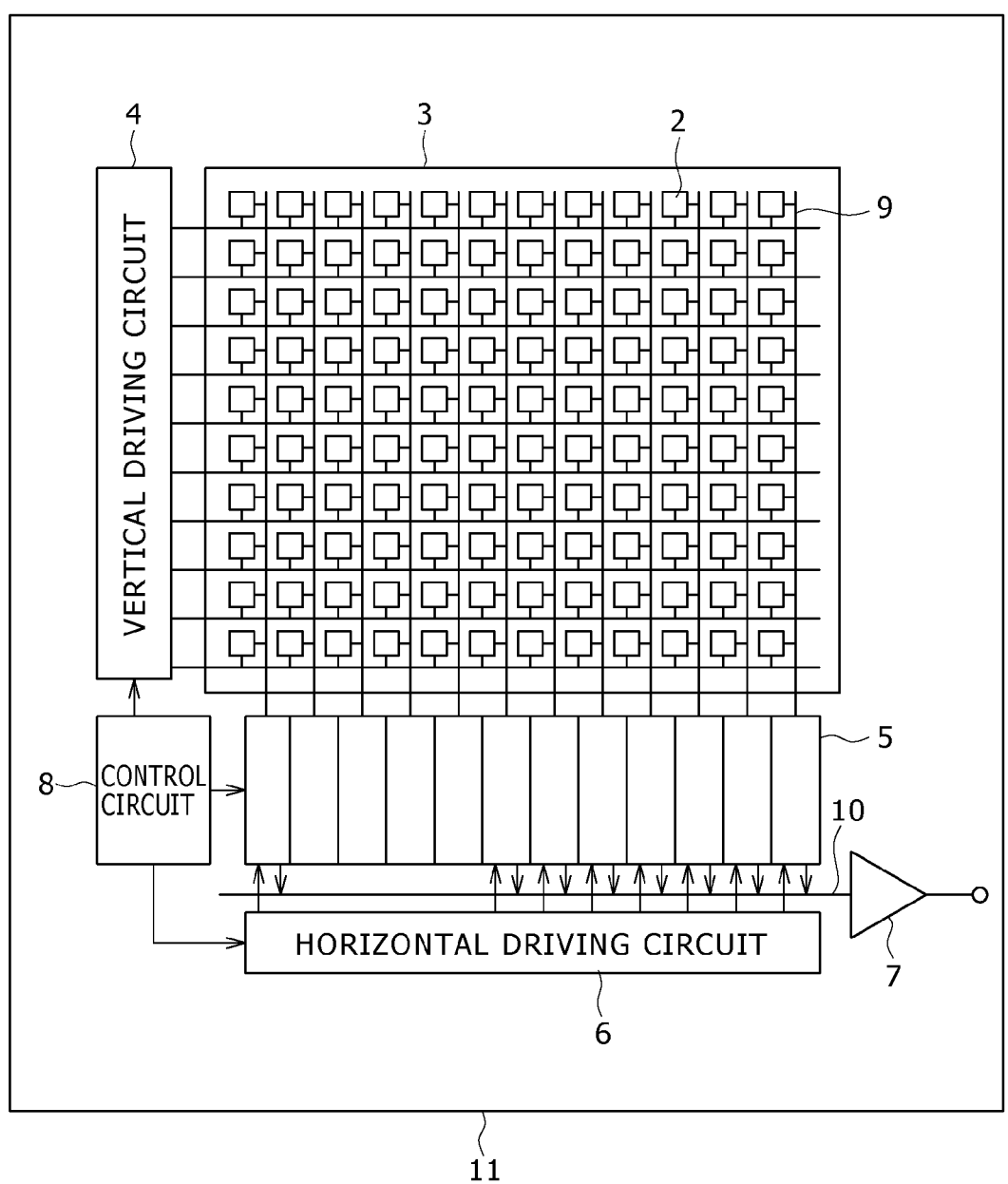
FIG. 1 is a block diagram, partly in circuit, showing schematically an entire configuration of a solid-state image pickup device according to a first embodiment of the present invention.

1. First Embodiment: Solid-State Image Pickup Device
1-1 Entire Configuration
1-2 Structure of Main Portion
1-3 Manufacturing Method
1-4 Change 1
1-5 Change 2
1-6 Change 3
2. Second Embodiment: Solid-State Image Pickup Device
3. Third Embodiment: Solid-State Image Pickup Device
4. Fourth Embodiment: Electronic Apparatus 1. First Embodiment Solid-State Image Pickup Device Firstly, a CMOS type solid-state image pickup device 1 according to a first embodiment of the present invention will be described with reference to FIG. 1. A configuration of the CMOS type solid-state image pickup device 1 shown in FIG. 1 is common to CMOS type solid-state image pickup devices according to the first to third embodiments which will be described below in order. In addition, in the first embodiment, the CMOS type solid-state image pickup device 1 is described as a back surface radiation type CMOS solid-state image pickup device.

[1-1 Entire Configuration]

FIG. 1 is a block diagram, partly in circuit, showing schematically an entire configuration of the CMOS type solid-state image pickup device 1 according to the first embodiment of the present invention.

The solid-state image pickup device 1 includes a pixel area 3, a vertical driving circuit 4, a column signal processing circuit 5, a horizontal driving circuit 6, an output circuit 7, a control circuit 8, and the like. In this case, the pixel area 3 is composed of a plurality of pixels 2 disposed on a substrate 11 made of silicon.

The pixel 2 is composed of a photodiode as a photoelectric conversion element, and a plurality of pixel transistors. A plurality of pixels 2 are regularly disposed in a two-dimensional array on the substrate 11. The pixel transistors composing each of the pixels 2 either may be four pixel transistors of a transferring transistor, a resetting transistor, a selecting transistor, and an amplifying transistor, or may be three transistors except for the selecting transistor, that is, the transferring transistor, the resetting transistor, and the amplifying transistor.

The pixel area 3 is composed of a plurality of pixels 2 regularly disposed in the two-dimensional array. Also, the pixel area 3 is composed of an effective pixel area and a black reference pixel area (not shown). In this case, in the effective pixel area, a light is actually received to generate signal electric charges through the photoelectric conversion, and the signal electric charges thus generated are then amplified to be read out to the column signal processing circuit 5. Also, the black reference pixel area is used to output optical black becoming a reference of a black level. The black reference pixel area is normally formed in an outer peripheral portion of the effective pixel area.

The control circuit 8 generates a clock signal, a control signal and the like each becoming a reference for each of operations of the vertical driving circuit 4, the column signal processing circuit 5, the horizontal driving circuit 6, and the like based on a vertical synchronous signal, a horizontal synchronous signal, and a master clock. Also, the clock signal, the control signal and the like which are generated in the control circuit 8 are inputted to each of the vertical driving circuit 4, the column signal processing circuit 5, the horizontal driving circuit 6, and the like.

The vertical driving circuit 4, for example, is composed of a shift register, and successively, vertically selects and scans the pixels 2 of the pixel area 3 in rows. Also, the vertical driving circuit 4 supplies pixel signals based on the signal electric charges generated in the photodiodes of the pixels in accordance with quantities of received lights to the column signal processing circuits 5 through the vertical signal lines 9, respectively.

The column signal processing circuit 5, for example, is disposed every column of the pixels 2, and executes signal processing such as noise removal and signal amplification for the signals outputted from the pixels 2 for one row by using a signal from the black reference pixel area (not shown every pixel column). Here, as has been described, the black reference pixel area is formed in the circumference of the effective pixel area. A horizontal selection switch (not shown) is provided between an output stage of the column signal processing circuit 5, and the horizontal signal line 10.

The horizontal driving circuit 6, for example, is composed of a shift register. Also, the horizontal driving circuit 6 successively outputs a horizontal scanning pulse to select the column signal processing circuits 5 in order, thereby causing the pixel signals from the respective column signal processing circuits 5 to be outputted to the horizontal signal line 10.

The output circuit 7 executes signal processing for the signals which are successively supplied thereto from the column signal processing circuits 5 through the horizontal signal lines 10, respectively, and outputs the resulting signals in order.

[1-2 Structure of Main Portion]

Figure 2:
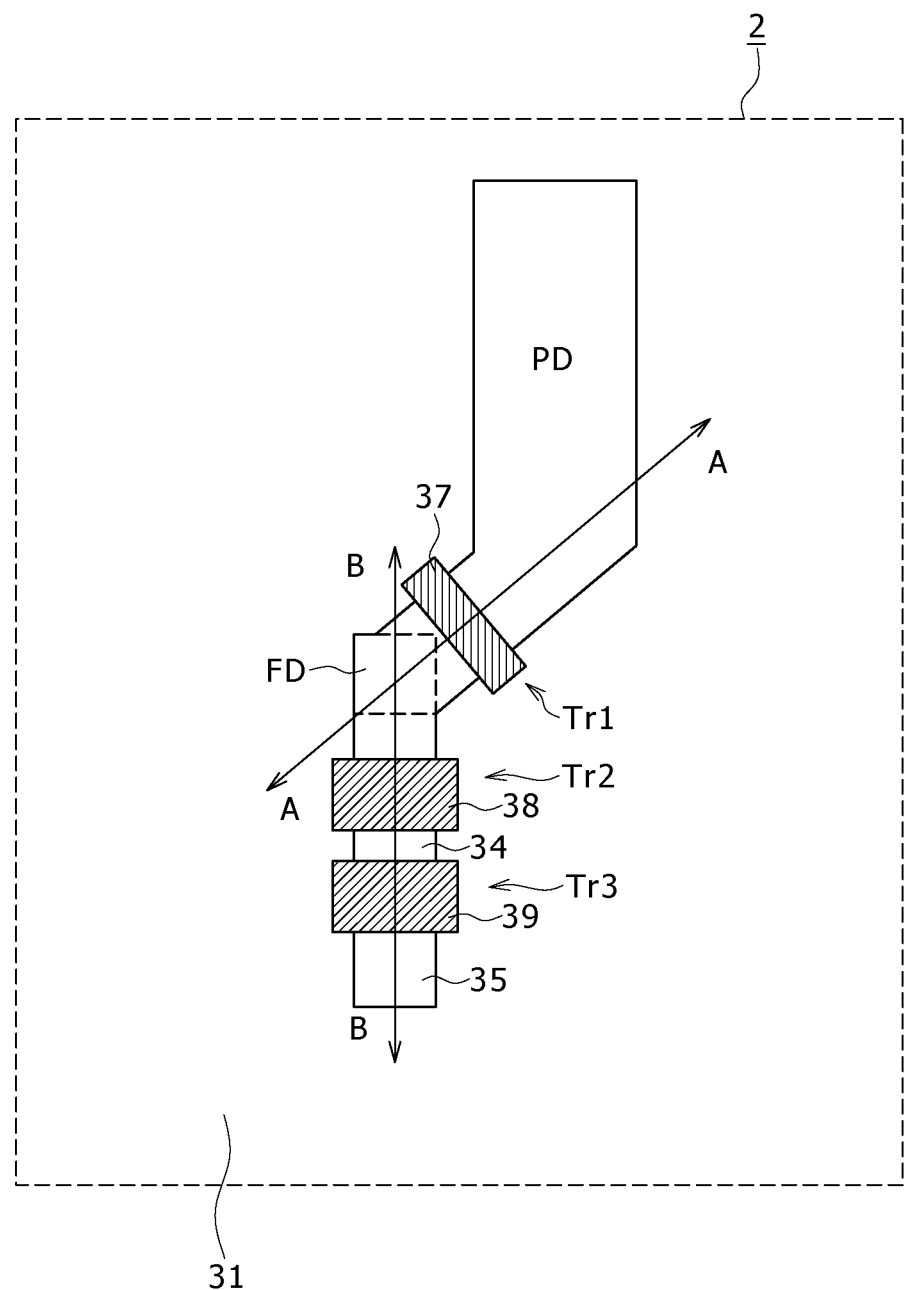
FIG. 2 is a schematic structural diagram of a unit pixel of the solid-state image pickup device according to the first embodiment of the present invention.

FIG. 2 is a schematic structural diagram showing a layout of a unit pixel 2 in the solid-state image pickup device 1 of the first embodiment when viewed from the back surface side of the semiconductor substrate. In addition, FIG. 3A is a schematic cross sectional view taken on line A-A of FIG. 2, and FIG. 3B is a schematic cross sectional view taken on line B-B of FIG. 2.

As shown in FIG. 2, the pixel 2 in the CMOS type solid-state image pickup device 1 of the first embodiment includes a photodiode PD serving as a photoelectric conversion element, a floating capacitance layer (hereinafter referred to as "a floating diffusion portion") FD, and a plurality of pixel transistors. A plurality of pixel transistors in the CMOS type solid-state image pickup device 1 of the first embodiment are composed of a transferring transistor Tr1, a resetting transistor Tr2, and an amplifying transistor Tr3.

The pixel area 3 composed of a plurality of pixels 2, as shown in FIGS. 3A and 3B, is formed within a pixel well region 21 of a second conductivity type (a p-type in the first embodiment). In this case, a conductivity type of a predetermined region extending from the front surface side to the back surface side of the semiconductor substrate 20 is converted from a first conductivity type (an n-type in the first embodiment) into the second conductivity type (p-type), thereby forming the pixel well region 21 of the second conductivity type.

The photodiode PD is composed of an n-type semiconductor region 40 formed within the pixel well region 21, and a p-type semiconductor region 41 formed on the front surface side of the semiconductor substrate 20 as a front surface side of the n-type semiconductor region 40. In the photodiode PD, the signal electric charges corresponding to a light quantity of incident light are generated by the photoelectric conversion, and are accumulated therein.

The floating diffusion portion FD is formed in a region adjacent to the photodiode PD on the front surface side of the n-type semiconductor substrate 20. Also, the floating diffusion portion FD is composed of an $n^+$-type impurity diffusion layer having an impurity concentration higher than that of the n-type semiconductor region 40 composing the photodiode PD. A region extending between the photodiode PD and the floating diffusion portion FD is a channel region of the transferring transistor Tr1.

In addition, an impurity region 34, 35 composing a source/drain region of the pixel transistor which will be described later is formed in a predetermined region on the back surface of the n-type semiconductor substrate 20 becoming a light incidence side. Also, gate electrodes 37, 38 and 39 are formed on the upper surface of the n-type semiconductor substrate 20 through a gate insulating film 42. The impurity region 34, 35 composing the source/drain region is composed of an $n^+$-type impurity diffusion layer having an impurity concentration higher than that of the n-type semiconductor region 40. In addition, each of the gate electrodes 37, 38 and 39 is made of polysilicon which is relatively, heavily doped with an n-type impurity.

The transferring transistor Tr1 is a MOS type transistor composed of a source region composed of the photodiode PD, a drain region composed of the floating diffusion portion FD, and the gate electrode 37 formed between the source region and the drain region. The transferring transistor Tr1 is serves as an electric charge reading portion. Thus, a desired transfer pulse is supplied to the gate electrode 37 of the transferring transistor Tr1, whereby the signal electric charges accumulated in the n-type semiconductor region 40 of the photodiode are read out to the floating diffusion portion FD.

The resetting transistor Tr2 is a MOS type transistor composed of a source region composed of the floating diffusion portion FD, a drain region, composed of the impurity region 34, to which a power source voltage VDD is supplied, and the gate electrode 38 formed between the source region and the drain region. In the resetting transistor Tr2, a desired reset pulse is supplied to the gate electrode 38 of the resetting transistor Tr2, whereby a potential of the floating diffusion portion FD is reset at a potential in the vicinity of the power source voltage VDD.

The amplifying transistor Tr3 is a MOS type transistor composed of a source region, composed of the impurity region 34, to which the power source voltage VDD is supplied, a drain region composed of the impurity region 35, and the gate electrode 39 formed between the source region and the drain region. In the amplifying transistor Tr3, a potential of the floating diffusion portion FD is supplied to the gate electrode 39 of the amplifying transistor Tr3, whereby the pixel signal corresponding to the potential thus supplied is outputted to the impurity region 35 serving as the drain region.

In addition, a sidewall 43, for example, made from a silicon oxide film is formed on each of sidewalls of the gate electrodes 37, 38 and 39 of the transferring transistor Tr1, the resetting transistor Tr2 and the amplifying transistor Tr3. Also, an offset region 33 composed of an $n^-$-type impurity region having an impurity concentration lower than that of the $n^+$-type impurity region 34, 35 composing the source/drain region is formed right below each of the sidewalls 43 of the amplifying transistor Tr3 and the resetting transistor Tr2.

An isolation region 31 for electrically isolating between each adjacent two pixels 2 is composed of an isolation layer 31a, and a channel stopper layer 31b formed on a surface of the isolation layer 31a. The isolation layer 31a is composed of a p-type impurity region having an impurity concentration higher than that of the p-type well region 21. In addition, the channel stopper layer 31b is composed of a p-type impurity region having an impurity concentration lower than that of the p-type isolation layer 31a.

Figure 4A:
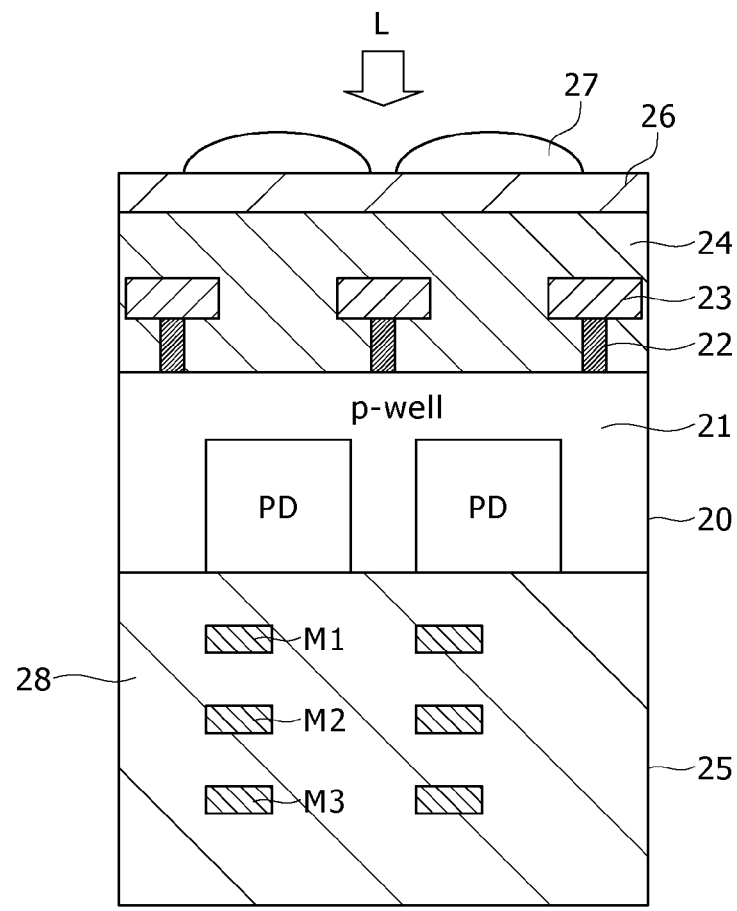
FIGS. 4A and 4B are respectively a cross sectional view showing a schematic structure of a main portion of the solid-state image pickup device according to the first embodiment of the present invention, and a top plan view showing a layout of a light blocking film of the solid-state image pickup device shown in FIG. 4A.

FIG. 4A shows a schematic cross sectional structure of the pixel area 3 of the CMOS type solid-state image pickup device 1 of the first embodiment. In FIG. 4A, in the n-type semiconductor substrate 20, only the photodiode PD composing the pixel 2 is shown, and the illustrations of the pixel transistors Tr1, Tr2 and Tr3, and the like described above are omitted here for the sake of simplicity.

As shown in FIG. 4A, in the CMOS type solid-state image pickup device 1 of the first embodiment, a multilayer wiring layer 25 having a plurality layer of (three layers in the first embodiment) wirings M1, M2 and M3 is formed on the front surface side of the n-type semiconductor substrate 20 having the photodiode PD formed therein. The multilayer wiring layer 25 has a structure in which the wirings M1, M2 and M3 are laminated through a front surface side interlayer insulating film 28, for example, made from a silicon oxide film. Each of the wirings M1, M2 and M3 composing the multilayer wiring layer 25, for example, is made of either copper (Cu) or aluminum (Al). In addition, predetermined wire connection is made between the desired wirings, and between the wirings M1, M2 and M3, and the elements such as the pixel transistors Tr1, Tr2 and Tr3 formed on the n-type semiconductor substrate 20 through metal contacts (not shown) each made of a metallic material such as copper (Cu) or tungsten (W).

In addition, a back surface side interlayer insulating film 24, for example, made from a silicon oxide film, and a light blocking film 23 for light-blocking between the pixels 2 are formed on the back surface side as the light incidence side of the semiconductor substrate 20. In the case, the light blocking film 23 is formed within the back surface side interlayer insulating film 24. Also, the light blocking film 23, for example, is made of aluminum. In addition, the light blocking film 23 in the first embodiment serves as a substrate potential supply wiring as well for applying a predetermined potential to the pixel well region 21 of the semiconductor substrate 20. For this reason, a back surface side contact portion (so-called well contact) 22 through which the pixel well region 21 and the light blocking film 23 are electrically connected to each other is formed within the back surface side interlayer insulating film 24 formed between the semiconductor substrate 20 and the light blocking film 23. In addition to aluminum or tungsten, platinum (Pt), nickel (Ni) or the like which can come into satisfactory ohmic contact with the pixel well region composed of the p-type impurity region having the relatively low impurity concentration can be adopted as a metallic material composing the back surface side contact portion 22.

Figure 4B:
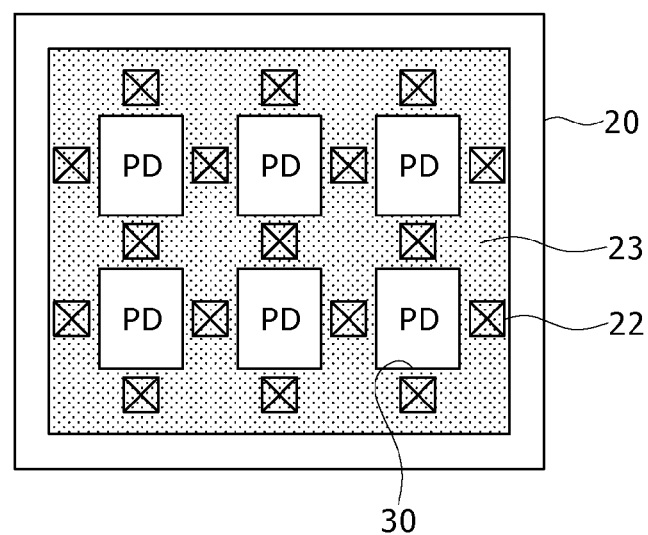

FIG. 4B shows a bottom plan view of a layout of the light blocking film 23 formed on the back surface of the semiconductor substrate 20. As shown in FIG. 4B, the light blocking film 23 is formed in such a way that the light receiving area in which the photodiode PD in the semiconductor substrate 20 is formed is opened by an opening portion 30. The back surface side contact portion 22 is formed between each adjacent two pixels 2. More specifically, the back surface side contact portion 22 is disposed in an area which avoids the photodiode PD formed in the semiconductor substrate 20. All it takes is that the back surface side contact portion 22 is disposed in the area which avoids the photodiode PD. Also, the back surface side contact portion 22 may also be disposed in an area in which the pixel transistors Tr1, Tr2 and Tr3 or the like are disposed on the front surface side of the semiconductor substrate 20. Although in the first embodiment, the back surface side contact portions 22 are formed in the circumference of the opening portion 30, for example, the back surface side contact portion 22 may also be formed every pixel on one-by-one basis.

Next, a description will be given with respect to a section for applying a predetermined voltage to the light blocking film 23 serving as the wiring as well for the substrate potential for fixing a potential of the pixel well region 21 to a reference potential in the image pickup device 1 of the first embodiment.

Figure 5A:
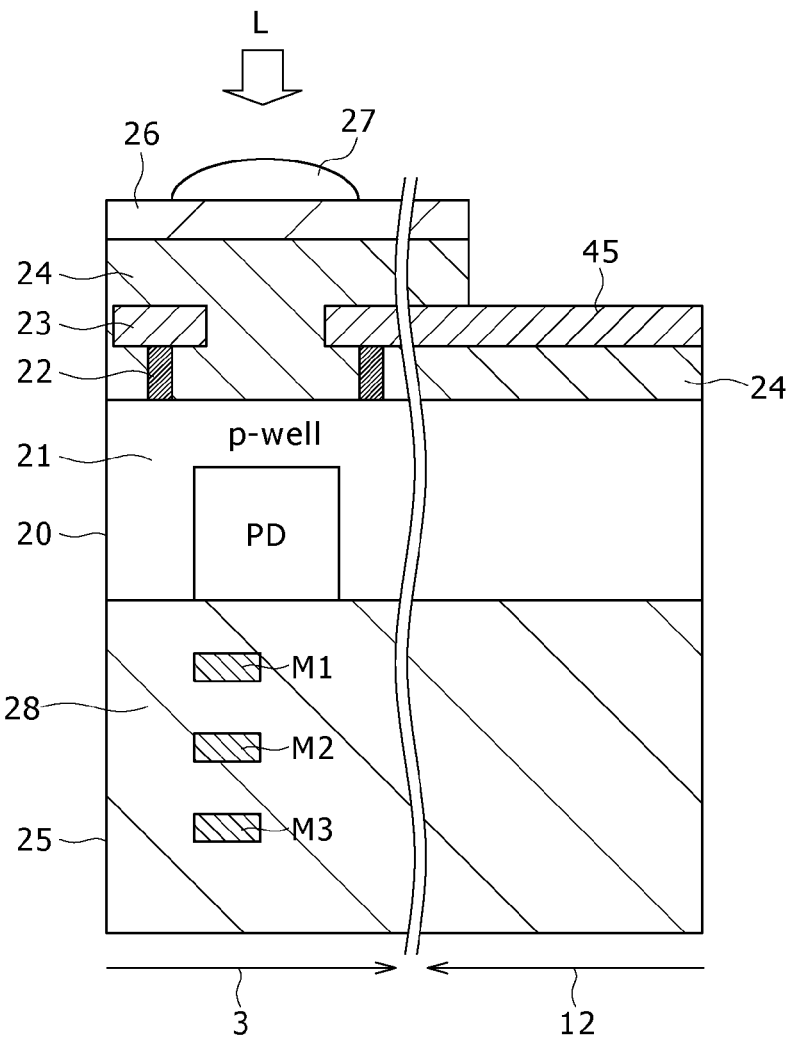
FIGS. 5A and 5B are respectively a cross sectional view showing a schematic structure of an area including a pixel area and a peripheral area of the solid-state image pickup device according to the first embodiment of the present invention, and a top plan view showing a layout of the light blocking film in the area shown in FIG. 5A.
Figure 5B:
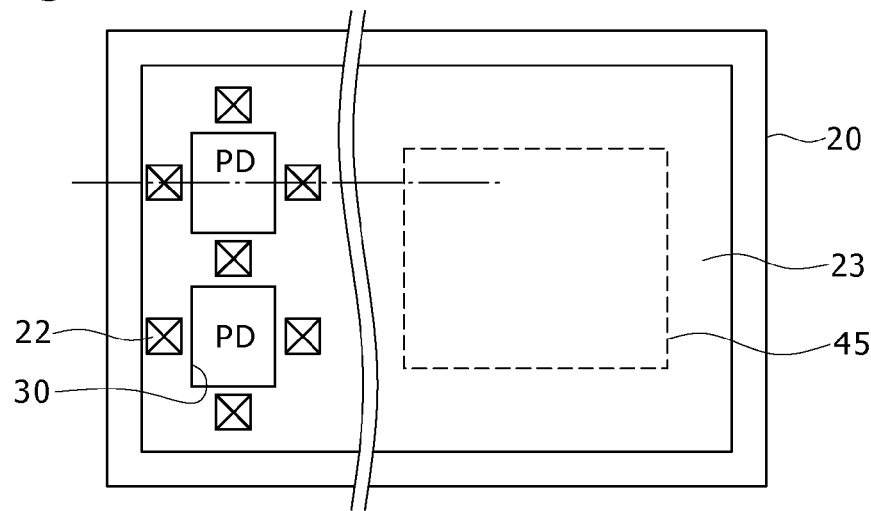

FIG. 5A is a cross sectional view showing a schematic structure of the area including the pixel area 3 and the peripheral area 12 of the CMOS type solid-state image pickup device 1 of the first embodiment. Also, FIG. 5B is a top plan view showing a layout of the light blocking film 23 in that area shown in FIG. 5A. That is to say, FIG. 5A is a cross sectional view taken on dashed line of FIG. 5B.

As shown in FIG. 5A, the light blocking film 23 serving as the wiring as well for the substrate potential for fixing the potential of the p-type pixel well region 21 to the reference potential is formed so as to extend up to the peripheral area 12 located more outside the pixel area 3. Also, a part of the light blocking film 23 is made a back surface side electrode pad 45. As a result, it is possible to adopt a structure in which the back surface side electrode pad 45 is connected to the wiring for the substrate potential (the light blocking film 23). Also, an opening portion is formed in the back surface side interlayer insulating film 24 so that the back surface side electrode pad 45 is exposed to the light receiving surface side, and an external wiring is connected to the back surface side electrode pad 45. As a result, since a predetermined voltage is applied to the light blocking film 23 serving as the wiring as well for the substrate potential through the external wiring, the potential of the pixel well region 21 is fixed to the predetermined potential.

[1-3 Manufacturing Method]

Figure 6A:
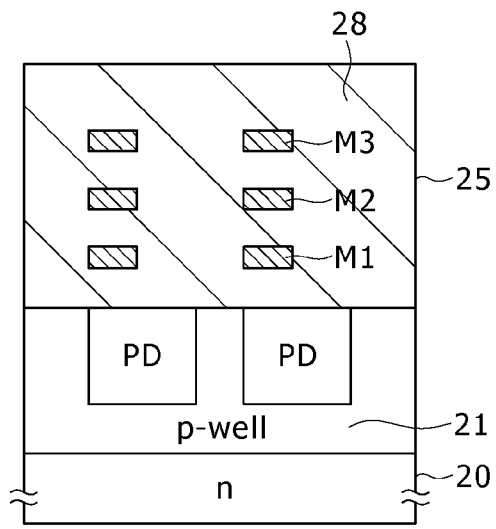
FIGS. 6A to 6D are respectively cross sectional views showing processes in a method of manufacturing the solid-state image pickup device according to the first embodiment of the present invention.

Next, a method of manufacturing the CMOS type solid-state image pickup device 1 of the first embodiment will be described with reference to FIGS. 6A to 7. FIGS. 6A to 7 are respectively cross sectional views showing processes for manufacturing the solid-state image pickup device 1 of the first embodiment.

Firstly, as shown in FIG. 6A, the pixel well region 21 composed of the p-type semiconductor layer having a depth of about several micrometers is formed on the front surface of the n-type semiconductor substrate 20 having a thickness of about 600 to about 800 μm. After that, the photodiode PD, the pixel transistors Tr1, Tr2 and Tr3, and the like are formed within the p-type pixel well region 21, thereby forming the pixel area 3 in which a plurality of pixels 2 are two-dimensionally disposed. After that, a process for depositing the front surface side interlayer insulating film 28 above the semiconductor substrate 20, and a process for forming the metal contact (not shown), and the wirings M1, M2 and M3 each made of the metallic material are repeatedly carried out. As a result, the multilayer wiring layer 25 is formed which is composed of the front surface side interlayer insulating film 28, and a plurality layer of (three layers in the first embodiment) of wirings M1, M2 and M3.

Figure 6B:
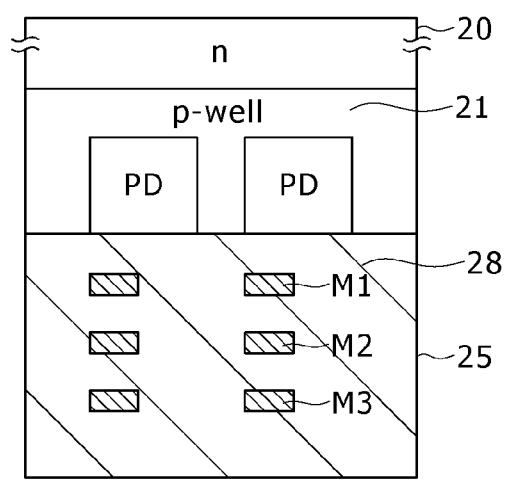
Figure 7:
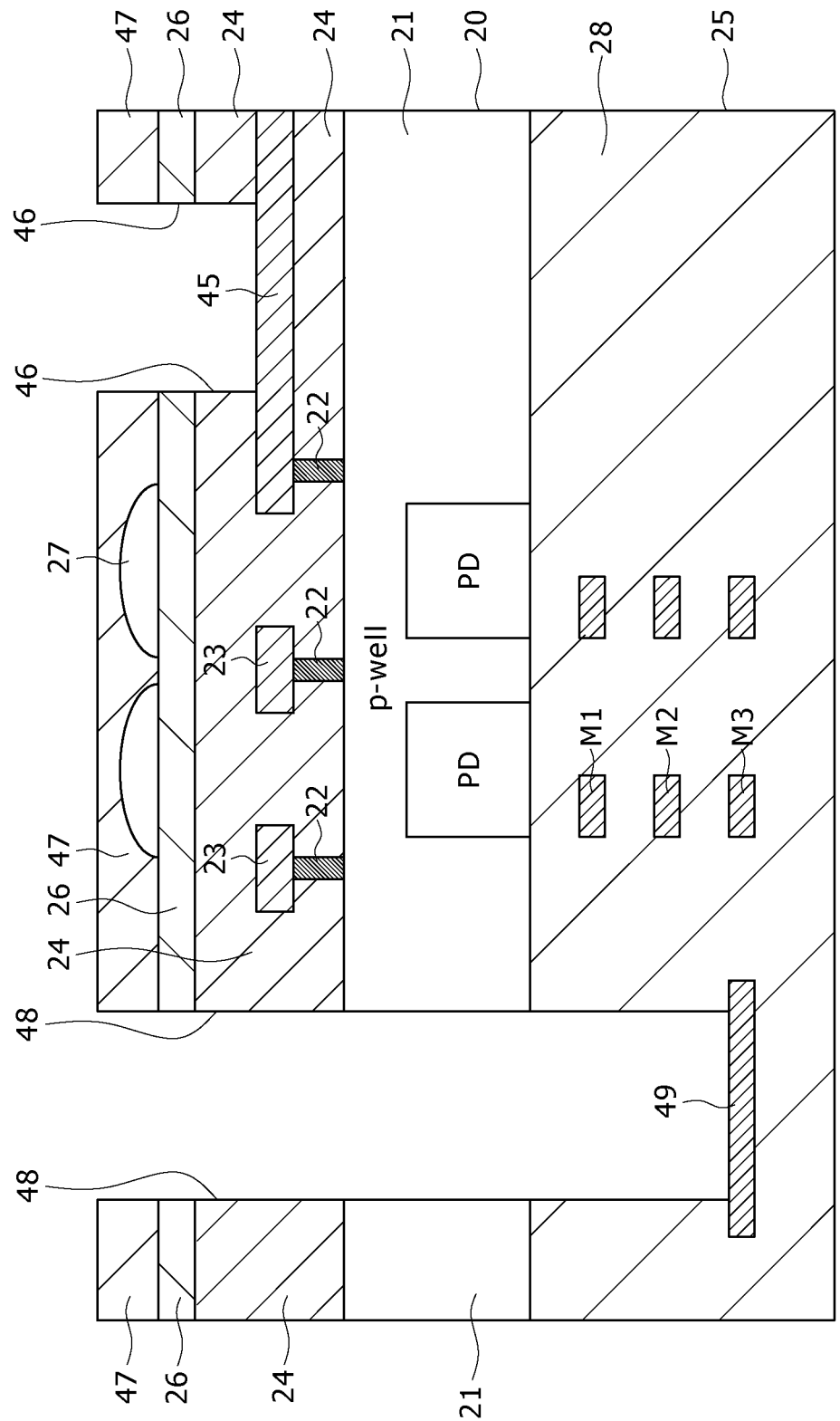
FIG. 7 is a cross sectional view showing process in the method of manufacturing the solid-state image pickup device according to the first embodiment of the present invention.

Next, as shown in FIG. 6B, after a supporting substrate (not shown in FIG. 6B), for example, made of silicon is stuck to the upper portion of the front surface side interlayer insulating film 28, the semiconductor substrate 20 is gradually removed from the back surface side to be thinned, thereby providing a state in which the pixel well region 21 is exposed to the back surface side (light receiving surface side). For example, after the semiconductor substrate 20 is shaved by several hundreds of micrometers by using a grinder, the semiconductor substrate 20 is removed by several tens of micrometers by utilizing a wet etching method, so that the semiconductor substrate 20 having a thickness of several micrometers is left on the supporting substrate, thereby making it possible to thin the n-type semiconductor substrate 20.

Figure 6C:
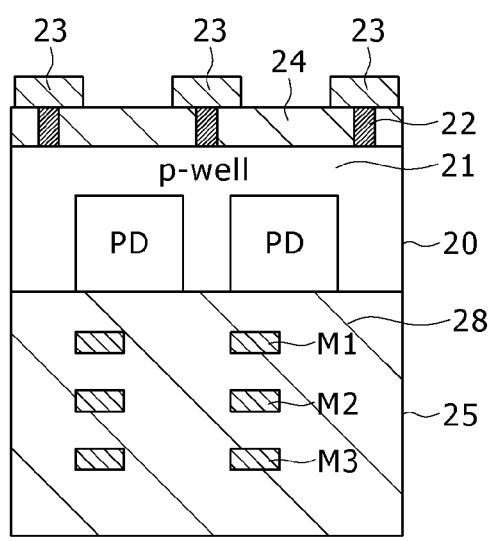

Next, as shown in FIG. 6C, the n-type semiconductor substrate 20 is reversed, and the back surface side interlayer insulating film 24, for example, made from a silicon oxide film is formed on the back surface side (light receiving surface side) of the semiconductor substrate 20 so as to have a thickness of about several hundreds of nanometers. Next, an opening is formed in the back surface side interlayer insulating film 24 to a depth reaching the n-type semiconductor substrate 20 by utilizing a dry etching method using a resist pattern, thereby forming a contact hole for the back surface side contact portion 22 through which the predetermined voltage is applied to the pixel well region 21. Next, for example, after a tungsten film is deposited to have a thickness of several hundreds of nanometers, a metallic material is filled in the contact hole by carrying out a planarizing process such as CMP. As previously described, platinum or nickel which can come into satisfactory ohmic contact with the p-type semiconductor having the low impurity concentration and composing the p-type pixel well region 21 can also be adopted as the metallic material filled in the contact hole. Next, after an aluminum film with a thickness of several hundreds of nanometers, for example, is deposited over an upper portion of the back surface side interlayer insulating film 24 including an upper portion of the back surface side contact portion 22, the aluminum film is patterned into a predetermined shape by utilizing a dry etching method using a resist pattern. As a result, the light blocking film 23 is formed which serves as the wiring as well for the substrate potential through which the predetermined voltage is applied to the p-type pixel well region 21.

Figure 6D:
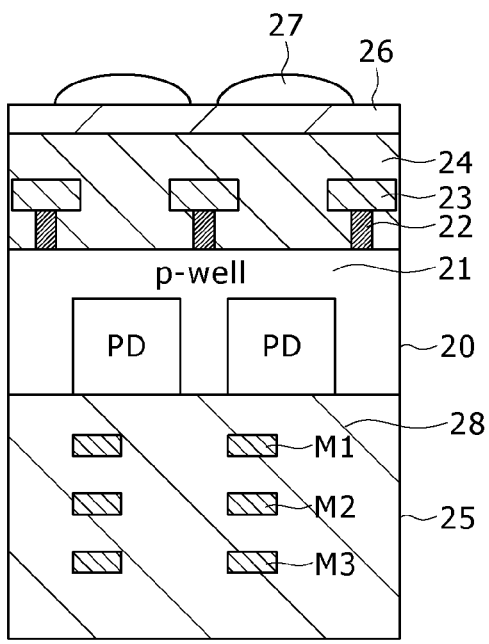

Also, as shown in FIG. 6D, after the back surface side interlayer insulating film 24, for example, made from a silicon nitride film is formed over the upper portion of the light blocking film 23 to have a thickness of several hundreds of nanometers, the color filter 26 and the on-chip lenses 27 are formed in order on the back surface side interlayer insulating film 24.

Also, as shown in FIG. 7, a protective layer 47 is formed over an upper portion of the on-chip lenses 27. After that, an opening portion 48 through which a surface of the front surface side electrode pad 49 composed of the wiring M3 formed as the uppermost layer (in a position remote from the semiconductor substrate 20) of the three wirings M1, M2 and M3 in the multilayer wiring layer 25 formed on the front surface side is formed by utilizing a dry etching method using a resist pattern. The front surface side electrode pad 49 is provided in order to electrically connect the external wiring to each of the wirings M1, M2 and M3 in the multilayer wiring layer 25 formed on the front surface side of the semiconductor substrate 20. Next, an opening portion 46 through which the surface of the back surface side electrode pad 45 formed in the wiring for the substrate potential for application of the predetermined voltage to the p-type pixel well region 21 is exposed to the light receiving surface side is formed by utilizing a dry etching method using a resist pattern. The opening portion 48 through which the front surface side electrode pad 49 is exposed, and the opening portion 46 through which the back surface side electrode pad 45 is exposed may be formed in different processes. If possible, however, the opening portion 48 and the opening portion 46 may also be formed in the same opening process by utilizing a dry etching using a resist pattern.

The solid-state image pickup device 1 of the first embodiment is completed in the manner as described above.

According to the first embodiment of the present invention, the wiring for the substrate potential, and the back surface side contact portion 22 which are structured in order to fix the potential of the pixel well region 21 of the semiconductor substrate 20 having the pixels 2 formed therein are provided on the light receiving surface side (back surface side) on the side opposite to the front surface side of the semiconductor substrate 20 having the pixels 2 formed therein. As a result, since it becomes unnecessary to form the section for holding the potential of the pixel well region 21 constant on the front surface side of the semiconductor substrate 20, the area of the photodiode PD, and the area of each of the elements such as the pixel transistors Tr1, Tr2 and Tr3 can be increased without changing the area of each of the unit pixels 2. Therefore, it is possible to improve the pixel characteristics such as the amount of saturated signal, and the random noise which have been the problems in the existing solid-state image pickup device. In addition, it is unnecessary to provide the pixel well potential fixing section composed of the wirings for the substrate potential and the back surface side contact portion 22 on the front surface side of the semiconductor substrate 20. Therefore, the degree of freedom of the wirings M1, M2 and M3 in the multilayer wiring layer 25 on the front surface side of the semiconductor substrate 20 is increased. For this reason, it is possible to realize the miniaturization of each of the pixels 2.

In addition, in the solid-state image pickup device 1 of the first embodiment, the back surface side contact portion 22 for holding the potential of the semiconductor substrate 20 constant can be formed in an area as long as this area is other than the light receiving area in which the photodiode PD is formed. For this reason, the section for holding the potential of the pixel well region 21 constant can be structured even at the center of the pixel area 3, and thus the potential of the pixel well region 21 can be held constant in each of the center and the circumference of the pixel area 3. As a result, it is possible to prevent the threshold value of each of the pixel transistors Tr1, Tr2 and Tr3 from being fluctuated between each adjacent two pixels 2. In addition, the coupling capacitance formed between the isolation region 31 and the wiring can also be prevented from being fluctuated within the pixel area 3. As a result, the deterioration of the pixel characteristics is prevented. In addition, at least one back surface side contact portion 22 is formed every pixel, whereby the potential of the pixel well region 21 is held constant in each of the pixels 2. As a result, it is possible to enhance the pixel characteristics because the potential of the pixel well region 21 is held constant in each of the pixels 2.

In addition, in the first embodiment, the light blocking film 23 which has been used in the past is used as the wiring for the substrate potential. Thus, the process for forming the back surface side constant portion 22 has only to be added to the related art, and thus the method of manufacturing the solid-state image pickup device 1 can be carried out by addition of the minimal process. For this reason, it is unnecessary to largely change the process, and thus the number of processes is not increased so much. In such a manner, the solid-state image pickup device 1 of the first embodiment can be relatively, readily obtained.

Figure 8:
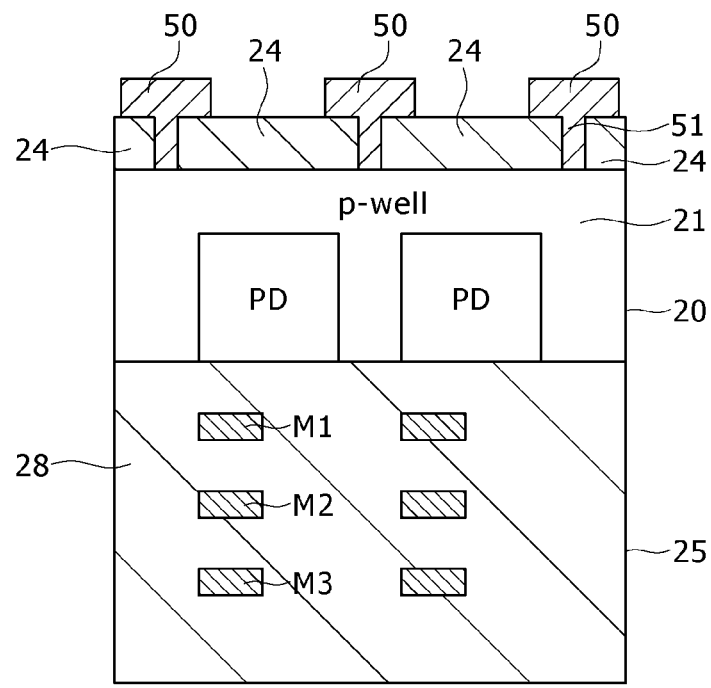
FIG. 8 is a cross sectional view showing Change of a process in the method of manufacturing the solid-state image pickup device according to the first embodiment of the present invention.

In the method of manufacturing the solid-state image pickup device 1 of the first embodiment, the process for forming the light blocking film 23, and the process for forming the back surface side contact portion 22 by filling the metallic material in the contact hole are carried out separately from each other. However, these two processes may be carried out at the same time. FIG. 8 is a cross sectional view showing a manufacturing process when the process for forming the light blocking film 23, and the process for forming the back surface side contact portion 22 by filling the metallic material in the contact hole are carried out at the same time.

As shown in FIG. 8, a metallic material is deposited on the entire surface of the back surface side interlayer insulating film 24 including the contact hole by utilizing a sputtering method, and is then planarized by utilizing the CMP, whereby the filling of the metallic material in the contact hole, and the deposition of the metallic film over the upper portion of the back surface side interlayer insulating film 24 are carried out at the same time. After that, the metallic film is patterned into a predetermined shape by utilizing a dry etching method using a resist pattern, thereby forming the back surface side contact portion 51 and the light blocking film 50 at the same time. When the formation of the light blocking film 50, and the formation of the back surface side contact portion 51 are carried out at the same time in the manner described above, the back surface side contact portion 51 and the light blocking film 50 are made of the same material.

In addition, in another Change in the method of manufacturing the solid-state image pickup device 1, it is possible to apply a damascene method in which after the opening of the contact hole, and the opening of the light blocking film are carried out in shape, the metallic material is filled in each of these opening portions.

In addition, although in the first embodiment, the structure of the light blocking film 23 and the structure of the back surface side contact portion 22 through which the light blocking film 23 and the semiconductor substrate 20 are electrically connected to each other are shown in FIGS. 4A and 4B, the present invention is by no means limited thereto. The layouts of the light blocking film and the back surface side portion in the solid-state image pickup device according to Changes 1 to 3 of the first embodiment, respectively, will be described below with reference to FIGS. 9 to 11.

[1-4 Change 1]

Figure 9:
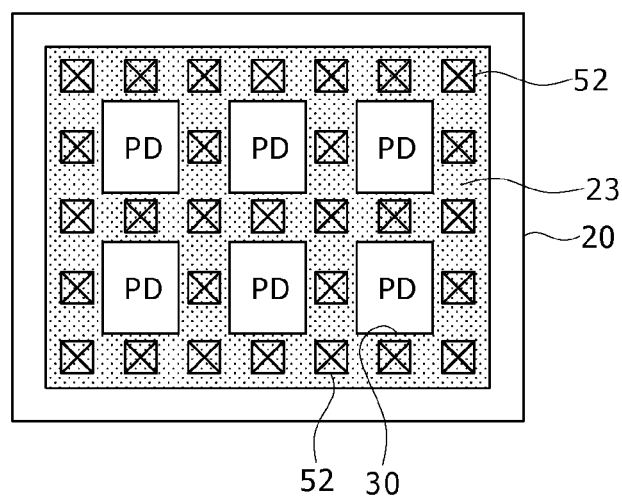
FIG. 9 is a top plan view showing a layout of the light blocking film and the back surface side contact portion according to Change 1 of the first embodiment of the present invention.

FIG. 9 shows the layout of the light blocking film serving as the wiring as well for the substrate potential, and the back surface side contact portion in the solid-state image pickup device 1 according to Change 1 of the first embodiment of the present invention. In FIG. 9, portions corresponding to those in FIG. 4B are designated by the same reference numerals, respectively, and a repeated description thereof is omitted here for the sake of simplicity.

As shown in FIG. 9, in Change 1, the light blocking film 23 serving as the wiring as well for the substrate potential has such an opening portion 30 that only the light receiving area of the photodiode PD of the semiconductor substrate 20 faces. Also, a plurality of back surface side contact portions 52 are disposed so as to surround the light receiving area. That is to say, in Change 1, a plurality of back surface side portions 52 are formed between each adjacent two pixels 2. By adopting such a layout, since the back surface side contact portion 52 made of the metallic material plays the function of the light blocking property between each adjacent two pixels 2, the mixture color suppressing effect is enforced.

[1-5 Change 2]

Figure 10:
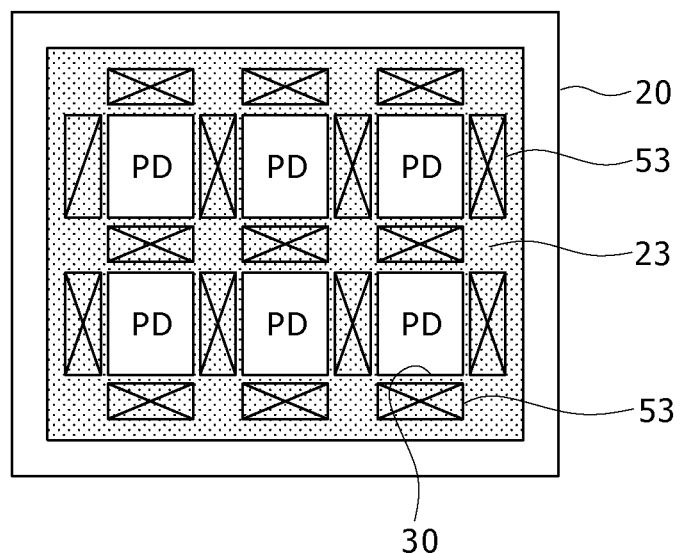
FIG. 10 is a top plan view showing a layout of the light blocking film and the back surface side contact portion according to Change 2 of the first embodiment of the present invention.

FIG. 10 shows the layout of the light blocking film serving as the wiring as well for the substrate potential, and the back surface side contact portion in the solid-state image pickup device 1 according to Change 2 of the first embodiment of the present invention. In FIG. 10, portions corresponding to those in FIG. 4B are designated by the same reference numerals, respectively, and a repeated description thereof is omitted here for the sake of simplicity.

As shown in FIG. 10, in Change 2, the light blocking film 23 serving as the wiring as well for the substrate potential has such an opening portion 30 that only the light receiving area of the photodiode PD of the semiconductor substrate 20 faces. Also, the four back surface side contact portion 53 are disposed along four sides of the opening portion 30, respectively. In addition, the four back surface side contact portions 53 are formed so as to have the same lengths as those of the four sides of the opening portion 30, respectively. By adopting such a layout, since the light blocking property between each adjacent two pixels 2 is further enhanced, it is possible to obtain the higher mixture color suppressing effect.

[1-6 Change 3]

Figure 11:
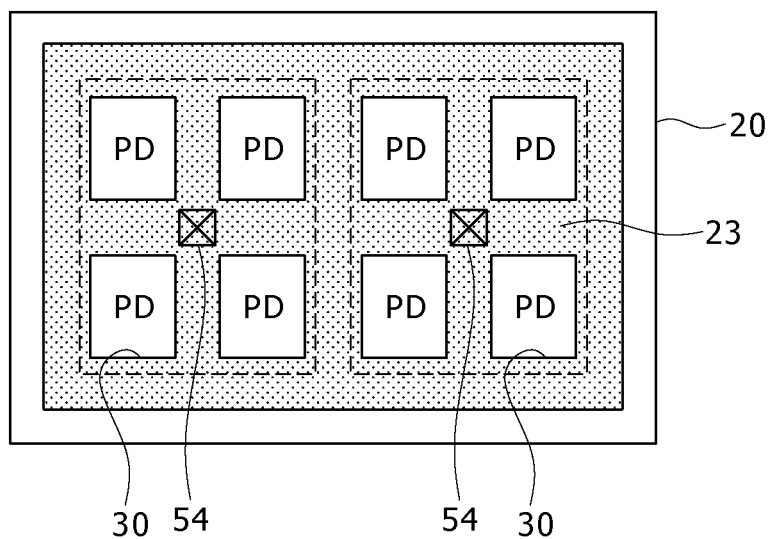
FIG. 11 is a top plan view showing a layout of the light blocking film and the back surface side contact portion according to Change 3 of the first embodiment of the present invention.

FIG. 11 shows the layout of the light blocking film serving as the wiring as well for the substrate potential, and the back surface side contact portion in the solid-state image pickup device 1 according to Change 3 of the first embodiment of the present invention. In FIG. 11, portions corresponding to those in FIG. 4B are designated by the same reference numerals, respectively, and a repeated description thereof is omitted here for the sake of simplicity.

As shown in FIG. 11, in Change 3, the light blocking film 23 serving as the wiring as well for the substrate potential has such an opening portion 30 that only the light receiving area of the photodiode PD of the semiconductor substrate 20 faces. Also, one back surface side contact portion 54 is formed every four pixels. That is to say, in Change 3, the one back surface side contact portion 54 is shared among four pixels 2. By adopting such a layout, the formation of the one back surface side contact portion 54 is simplified.

As shown in FIGS. 9 to 11, according to Change 1 to 3 of the first embodiment of the present invention, in the solid-state image pickup device 1, the disposition of the one back surface side contact portion 52, 53, 54 can be suitably carried out in accordance with the layout of the unit pixel 2.

2. Second Embodiment

Solid-State Image Pickup Device

Next, a solid-state image pickup device according to the second embodiment of the present invention will be described with reference to FIG. 12. Although in the solid-state image pickup device 1 of the first embodiment, the light blocking film 23 serves as the wiring as well for the substrate potential, in the solid-state image pickup device 1 of the second embodiment, the light blocking film 23 and the wiring for the substrate potential are formed independently of each other.

Figure 12:
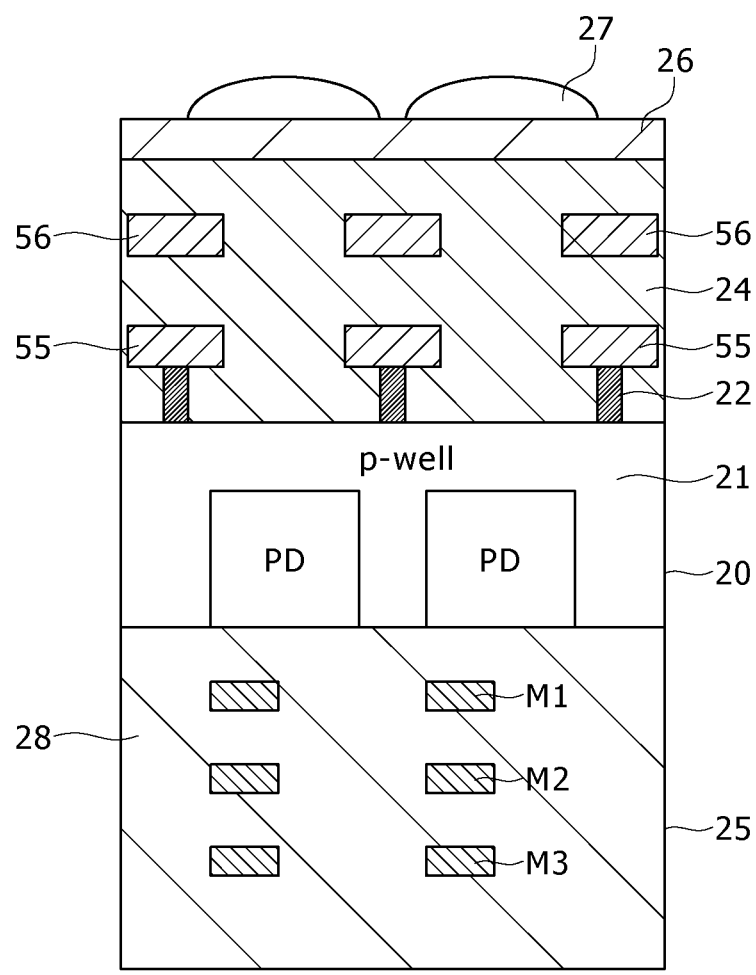
FIG. 12 is a cross sectional view showing a schematic structure of a main portion of a solid-state image pickup device according to a second embodiment of the present invention.

FIG. 12 is a cross sectional view showing a schematic structure of the solid-state image pickup device according to the second embodiment of the present invention. In FIG. 12, portions corresponding to those in FIG. 4A are designated by the reference numerals, respectively, and a repeated description thereof is omitted here for the sake of simplicity. In the solid-state image pickup device 1 of the second embodiment, a wiring 55 for a substrate potential which serves to fix the substrate potential is formed on the back surface side becoming the light incidence side of the semiconductor substrate 20 through the back surface side interlayer insulating film 24, for example, made from a silicon oxide film. Also, the wiring 55 for a substrate potential is electrically connected to the semiconductor substrate 20 through the back surface side contact portion 22. A light blocking film 56 for light-blocking between each adjacent two pixels 2 is further formed on an upper portion of the wiring 55 for a substrate potential through the laminated back surface side interlayer insulating film 24.

Figure 13:
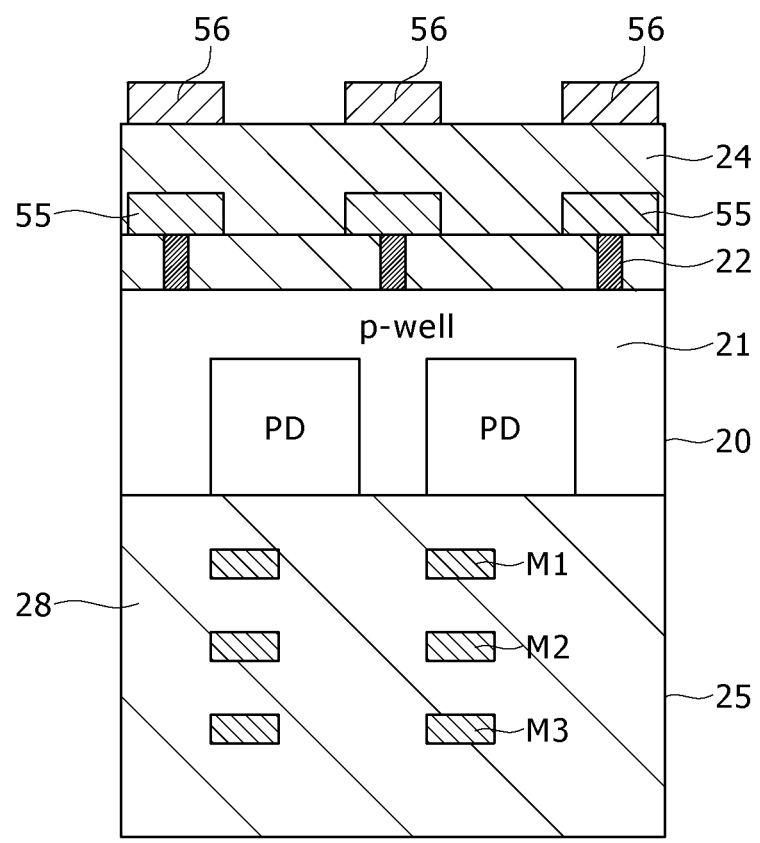
FIG. 13 is a cross sectional view showing a process in a method of manufacturing the solid-state image pickup device according to the second embodiment of the present invention.

FIG. 13 is a cross sectional view showing a manufacturing process in a method of manufacturing the solid-state image pickup device according to the second embodiment of the present invention. Since the processes before the process shown in FIG. 13 are the same as those shown in FIGS. 6A to 6D in the method of manufacturing the solid-state image pickup device 1 of the first embodiment, respectively, a repeated description thereof is omitted here for the sake of simplicity.

As shown in FIG. 13, after the back surface side interlayer insulating film 24, for example, made from the silicon oxide film is formed so as to have a thickness of about several hundreds of nanometers, the contact hole is formed in the back surface side interlayer insulating film 24 to the depth reaching the semiconductor substrate 20, and the tungsten film, for example, is then deposited to have a thickness of about several hundreds of nanometers. After that, by carrying out the planarizing process such as the CMP, tungsten is filled in the contact hole, thereby completing the back surface side contact portion 22. Also, for example, an aluminum film having a thickness of about several hundreds of nanometers is deposited over the back surface side interlayer insulating film 24 including the back surface side contact portion 22. Also, the aluminum film is patterned into a predetermined shape by utilizing a dry etching method using a desired resist pattern, thereby forming the wiring 55 for the substrate potential. Next, the back surface side interlayer insulating film 24, for example, made from the silicon oxide film is further formed to have a thickness of several hundreds of nanometers. After that, the surface of the back surface side interlayer insulating film 24 is planarized by utilizing the CMP or the like, and an aluminum film, for example, is deposited on the back surface side interlayer insulating film 24 to have a thickness of several hundreds of nanometers. Thereafter, the aluminum film is patterned into a predetermined shape by utilizing a dry etching method using a desired resist pattern, thereby forming the light blocking film 56.

The light blocking film 56 in the second embodiment is formed so as to light-block between each adjacent two pixels 2 similarly to the case of the light blocking film 23 in the first embodiment. Also, for example, the light blocking film 56 in the second embodiment is formed so as to have the opening portion only in the light receiving area of the photodiode PD.

In addition, in the second embodiment, since the light blocking film 56 and the wiring 55 for the substrate potential are formed independently of each other, the planar layout of the wiring 55 for the substrate potential needs not to be aligned with the shape of the light blocking film 56. For this reason, the planar layout of the wiring 55 for the substrate potential can be freely set.

Figure 14A:
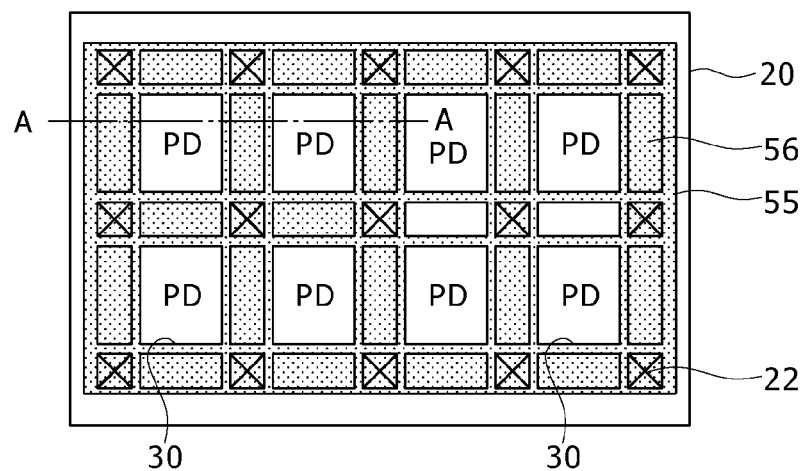
FIGS. 14A and 14B are respectively a top plan view showing a layout of Change of the second embodiment of the present invention, and a cross sectional view taken on line A-A of FIG. 14A.
Figure 14B:
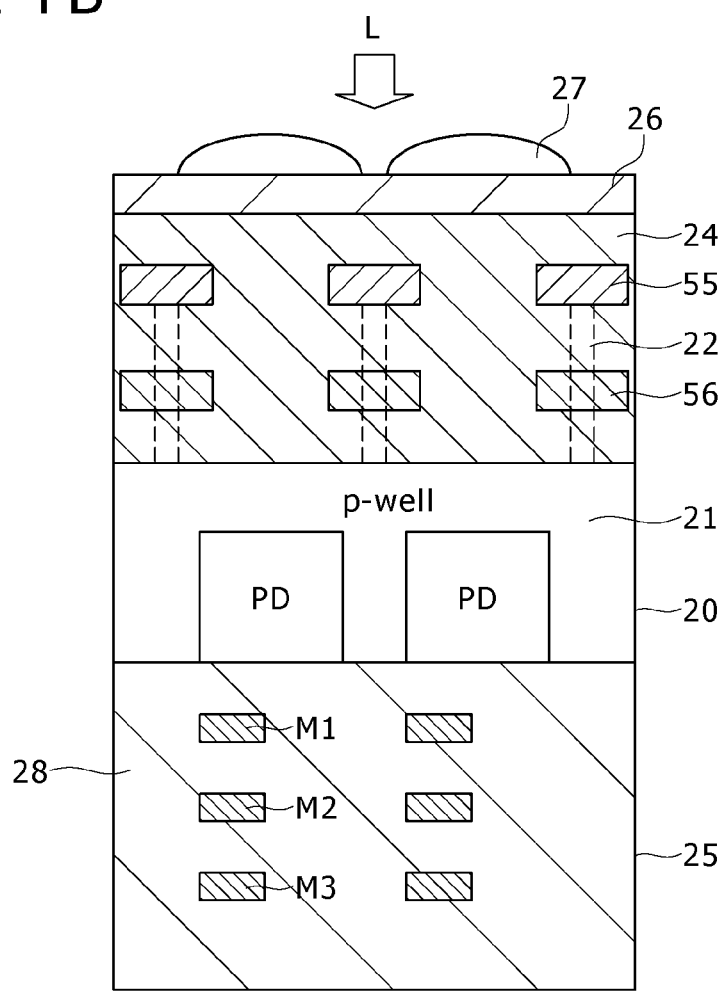

In the second embodiment of the present invention, after the wiring 55 for the substrate potential through which the predetermined voltage is applied to the pixel well region 21 of the semiconductor substrate 20 is firstly formed, the light blocking film 56 is then formed. However, the order of formation of the wiring 55 for the substrate potential, and the light blocking film 56 may be reversed in some cases. FIG. 14A is a top plan view showing a layout of the light blocking film 56 and the wiring 55 for the substrate potential when the light blocking film 56 is formed on the side of the semiconductor substrate 20, and the wiring 55 for the substrate potential is formed on the light incidence side. Also, FIG. 14B is a cross sectional view taken on line A-A of FIG. 14A. In this case, as shown in FIG. 14A, the back surface side contact portion 22 is disposed in an area in which the light blocking film 56 formed in a lower layer is not formed. Even when the light blocking film 56 is formed on the side of the semiconductor substrate 20, the same effect as that in the second embodiment can be obtained.

3. Third Embodiment

Solid-State Image Pickup Device

Next, a solid-state image pickup device according to a third embodiment of the present invention will be described with reference to FIGS. 15A and 15B. The solid-state image pickup device of the third embodiment is different in the section for applying the potential to the wiring for the substrate potential from the solid-state image pickup device of the first embodiment.

Figure 15A:
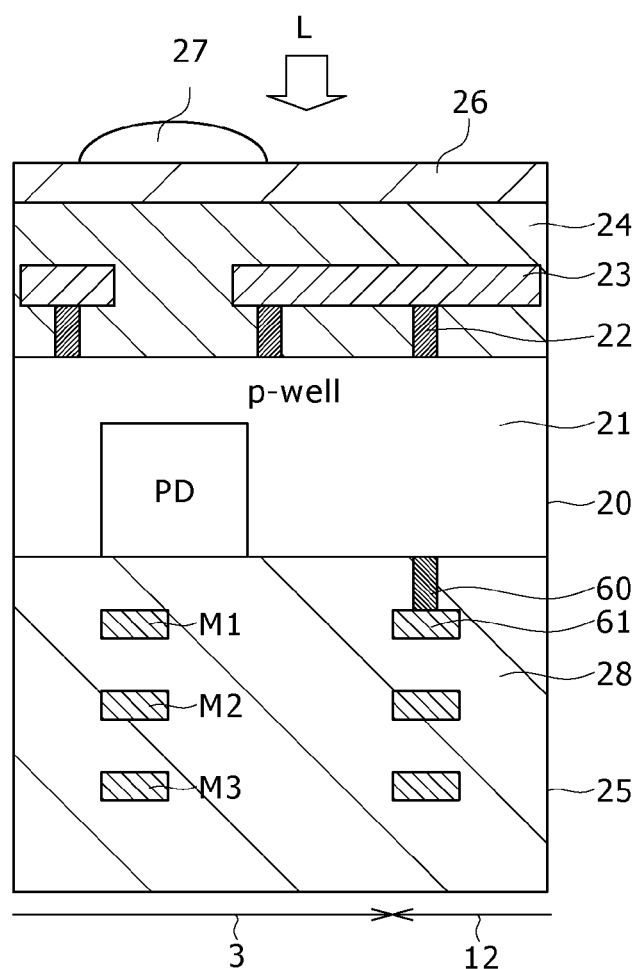
FIGS. 15A and 15B are respectively a cross sectional view showing a schematic structure of a main portion of a solid-state image pickup device according to a second embodiment of the present invention, and a top plan view showing a layout of the main portion of the solid-state image pickup device shown in FIG. 15A.
Figure 15B:
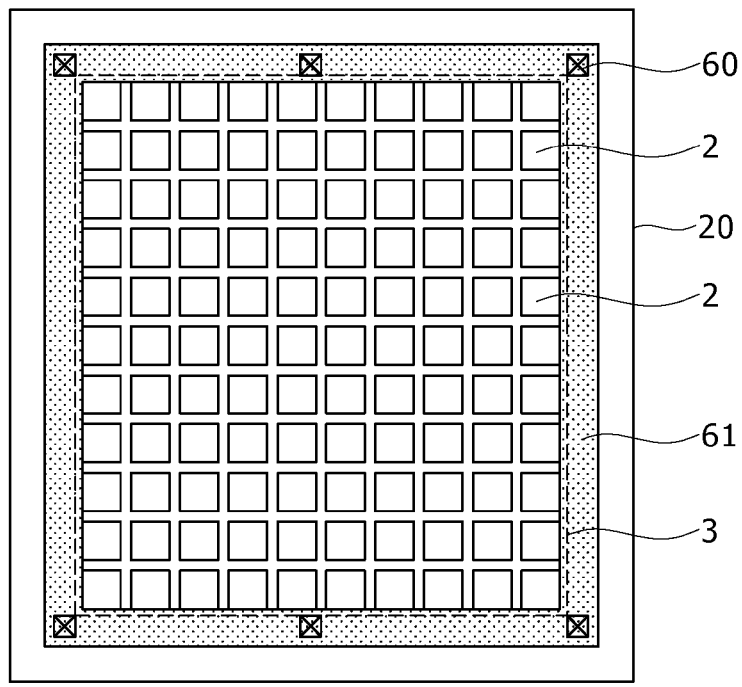

FIG. 15A is a cross sectional view showing a schematic structure of the solid-state image pickup device according to the third embodiment of the present invention. Also, FIG. 15B is a top plan view showing a structure of a main portion of the solid-state image pickup device shown in FIG. 15A. In FIG. 15A, portions corresponding to those in FIG. 4A are designated by the same reference numerals, respectively, and a repeated description thereof is omitted here for the sake of simplicity.

In the third embodiment, as shown in FIG. 15A, a front surface side contact portion 60 through which a desired wiring 61 composing the multilayer wiring layer 25 formed on the front surface side of the semiconductor substrate 20, and a pixel well region 21 of the semiconductor substrate 20 are electrically connected to each other is formed in an outermost periphery of the pixel area 3. The wiring 61 which is electrically connected to the pixel well area 21 through the front surface side contact portion 60 is formed in an area surrounding the outermost periphery of the pixel area 3. Also, the wiring 61 is connected to the pixel well region 21 through the front surface side contact portion 60 in the peripheral area formed more outside the pixel area 3.

In the third embodiment, by applying a desired voltage to the wiring 61 formed on the front surface side of the semiconductor substrate 20, and the wiring 61 and the wiring for the substrate potential serving as the light blocking film 23 as well and formed on the back surface side of the semiconductor substrate 20 are electrically connected to each other through the semiconductor substrate 20. As a result, the potential of the pixel well region 21 of the semiconductor substrate 20 is fixed to the reference potential.

According to the third embodiment of the present invention, the potential of the wiring for the substrate potential formed on the back surface side of the semiconductor substrate 20 is fixed to the potential which is supplied to the wiring 61 on the front surface side of the semiconductor substrate 20. For this reason, in the wiring for the substrate potential which is formed on the back surface side of the semiconductor substrate 20, it is unnecessary to form the back surface side electrode pad 45 as shown in FIG. 7. Thus, the external electrode is connected to the front surface side electrode pad 49 which has been used in the past, thereby supplying the voltage to the wiring for the substrate potential. In addition, with regard to the formation of the front surface side contact portion 60 through which the wiring 61 in the multilayer wiring layer 25 formed on the front surface side of the semiconductor substrate 20, and the pixel well region 21 are connected to each other, the front surface side contact portion 60 has to be formed concurrently with the formation of the contact portion through which desires one(s) of the pixel transistors Tr1, Tr2 and Tr3, and the wirings M1, M2 and M3 are connected to each other. For this reason, since this process configures the section for applying the potential to the wiring for the substrate potential, the number of processes is prevented from being increased.

In addition, in the third embodiment as well, the planar layouts of Changes 1 to 3 of the first embodiment can also be adopted for the light blocking film 23 serving as the wiring as well for the substrate potential. In this case, the same effect as that in the first embodiment can be obtained.

Although in each of the first to third embodiments of the present invention, the electron is used as the signal electric charge, and thus the first conductivity type is taken to be the n-type and the second conductivity type is taken to be the p-type, the present invention can also be applied to a solid-state image pickup device in which a hole is used as the signal electric charge. In this case, the first conductivity type is taken to be the p-type and the second conductivity type is taken to be the n-type, and thus the semiconductor regions described above can be structured as the semiconductor regions of the opposite conductivity types.

Each of the first to third embodiments of the present invention has been described by exemplifying the case where the present invention is applied to the CMOS type solid-state image pickup device in which the unit pixels each detecting the signal electric charges corresponding to the quantity of incident light as the physical quantity are disposed in a matrix. However, the present invention is by no means limited to the application to the CMOS type solid-state image pickup device. In addition, the present invention is by no means limited to the whole solid-state image pickup device utilizing the column system in which the column circuit is disposed every pixel column of the pixel portion having the pixels formed therein in the two-dimensional matrix. In addition, although in each of the first to third embodiments of the present invention, the pixel is composed of the three pixel transistors of the transferring transistor, the resetting transistor and the amplifying transistor, the pixel may also be composed of the four pixel transistors composed by adding the selecting transistor to the three pixel transistors. In addition, with regard to the layouts of the photoelectric conversion element, and the MOS transistors within each of the pixels, various kinds of changes can be made without departing from the subject matter of the present invention.

In addition, although in each of the first to third embodiments of the present invention, the description has been given with respect to the case where the present invention is applied to the CMOS type solid-state image pickup device, the present invention can also be applied to the CCD type solid-state image pickup device. In this case, the signal electric charges read out by the reading portion in the present invention are transferred in the vertical direction by a vertical transferring register, are transferred in the horizontal direction by a horizontal transferring register, and are then amplified, thereby outputting a video signal.

In addition, the present invention is by no means limited to the application to the solid-state image pickup device for detecting the distribution of the quantities of incident visible lights to capture such a distribution in the form of an image. That is to say, the present invention can also be applied to a solid-state image pickup device for capturing the distribution of the incidence quantities of inferred rays, X rays, particles or the like in the form of an image. Also, in a broad sense, the present invention can also be applied to the whole solid-state image pickup device (physical quantity distribution detecting device), such as a fingerprint detecting sensor, for detecting a distribution of other suitable physical quantity such as a pressure or an electrostatic capacitance, thereby capturing such a distribution in the form of an image.

Moreover, the present invention is by no means limited to the solid-state image pickup device in which the unit pixels of the pixel portion are successively scanned in rows, thereby reading out the pixel signals from the unit pixels, respectively. That is to say, the present invention can also be applied to an X-Y address type solid-state image pickup device in which arbitrary pixels are selected in pixels, and signals are read out in pixels from the pixels thus selected, respectively.

It is noted that the solid-state image pickup device either may have a form in which the solid-state image pickup device is formed as one chip, or may have a module-like form, having an image pickup function, in which the pixel portion, and the signal processing portion or the optical portion are collectively packaged.

In addition, the present invention is by no means limited to the application to the solid-state image pickup device, and thus can also be applied to an image pickup apparatus. Here, the image pickup apparatus means an electronic apparatus, having an image pickup function, such as a camera system such as a digital still camera or a video camera, or a mobile phone. In is noted that the above module-like form mounted to the electronic apparatus, that is, a camera module may be made the image pickup apparatus in some cases.

4. Fourth Embodiment

Electronic Apparatus

Figure 16:
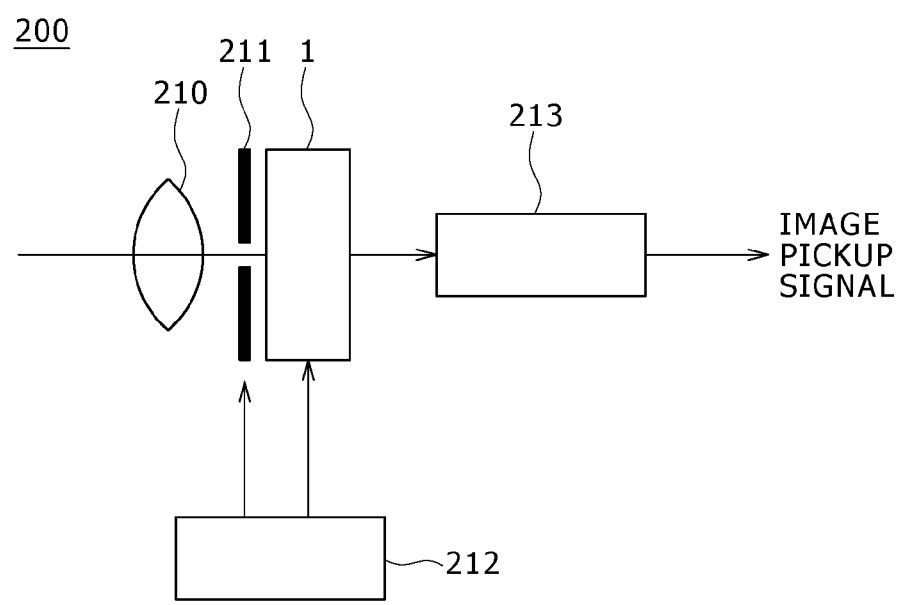
FIG. 16 is a block diagram showing a schematic configuration of an electronic apparatus according to a fourth embodiment of the present invention.
Figure 17:
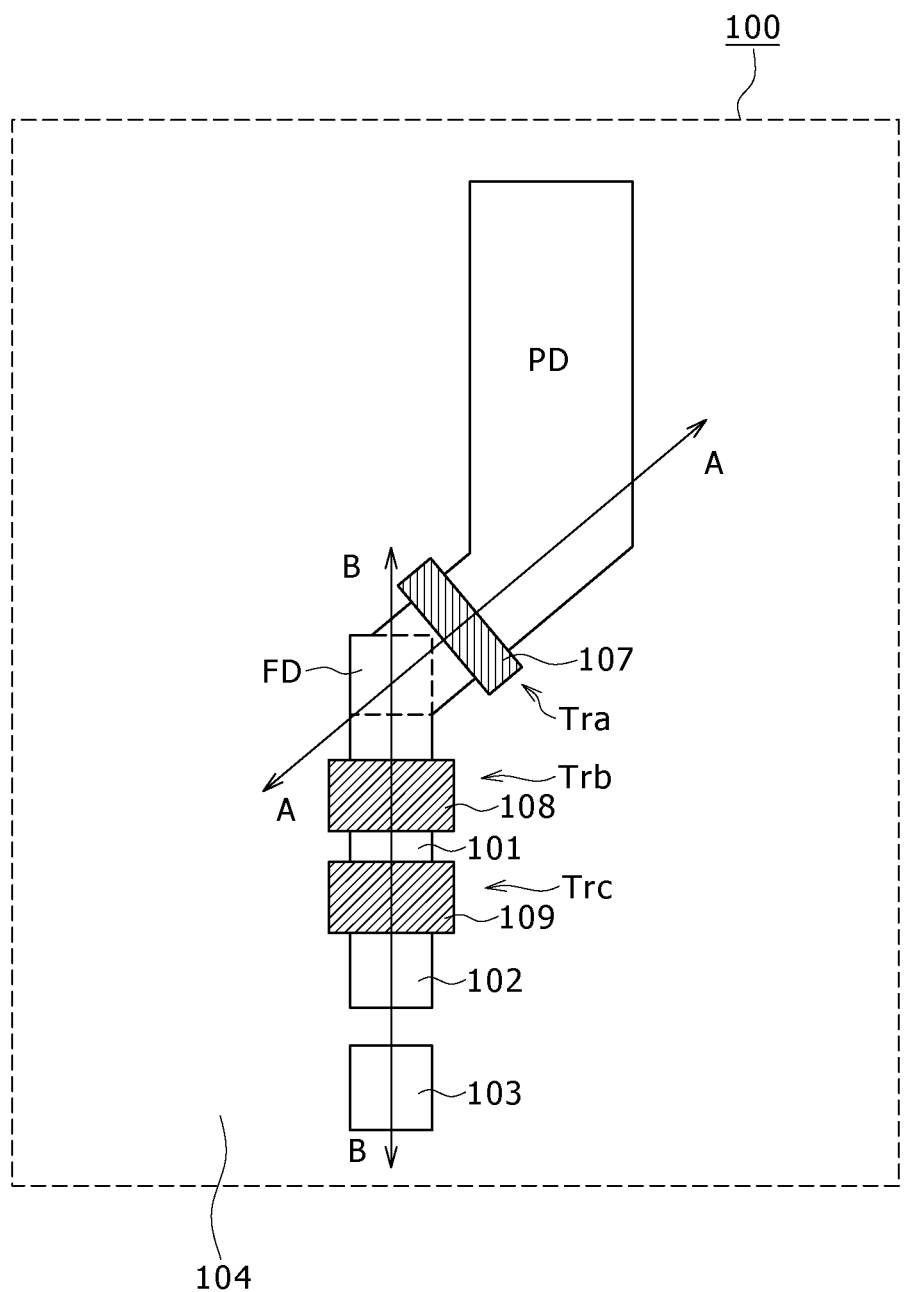
FIG. 17 is a schematic structural view showing a unit pixel cell of a solid-state image pickup device according to the related art.
Figure 19:
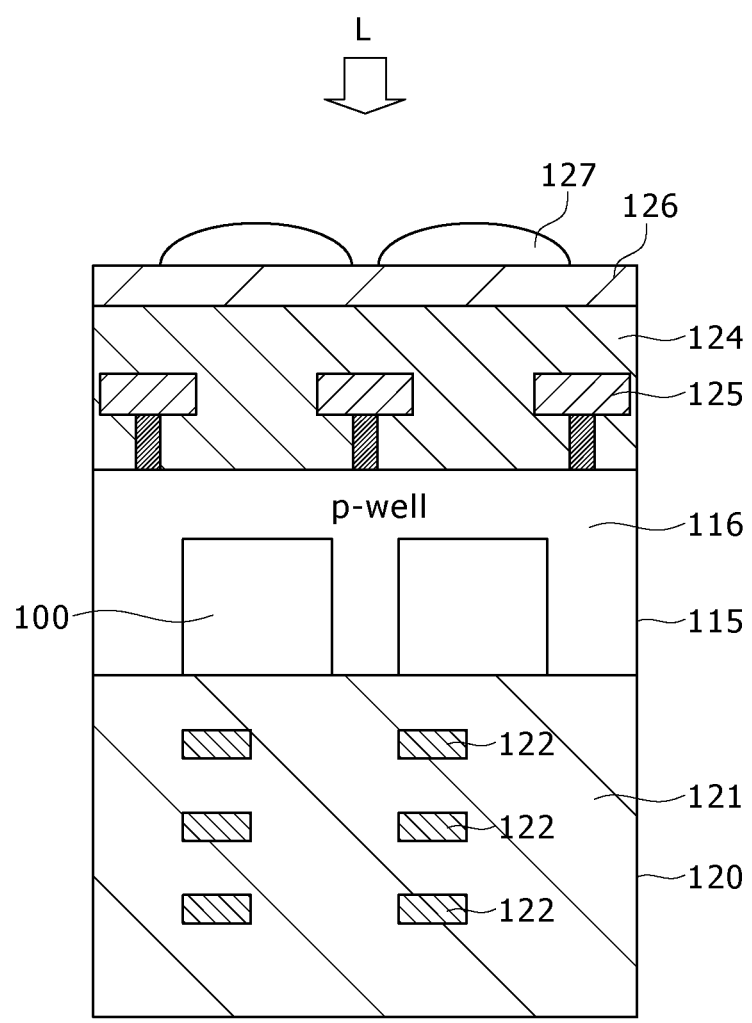
FIG. 19 is a cross sectional view showing a schematic structure of a main portion of the solid-state image pickup device according to the related art.
Figure 20:
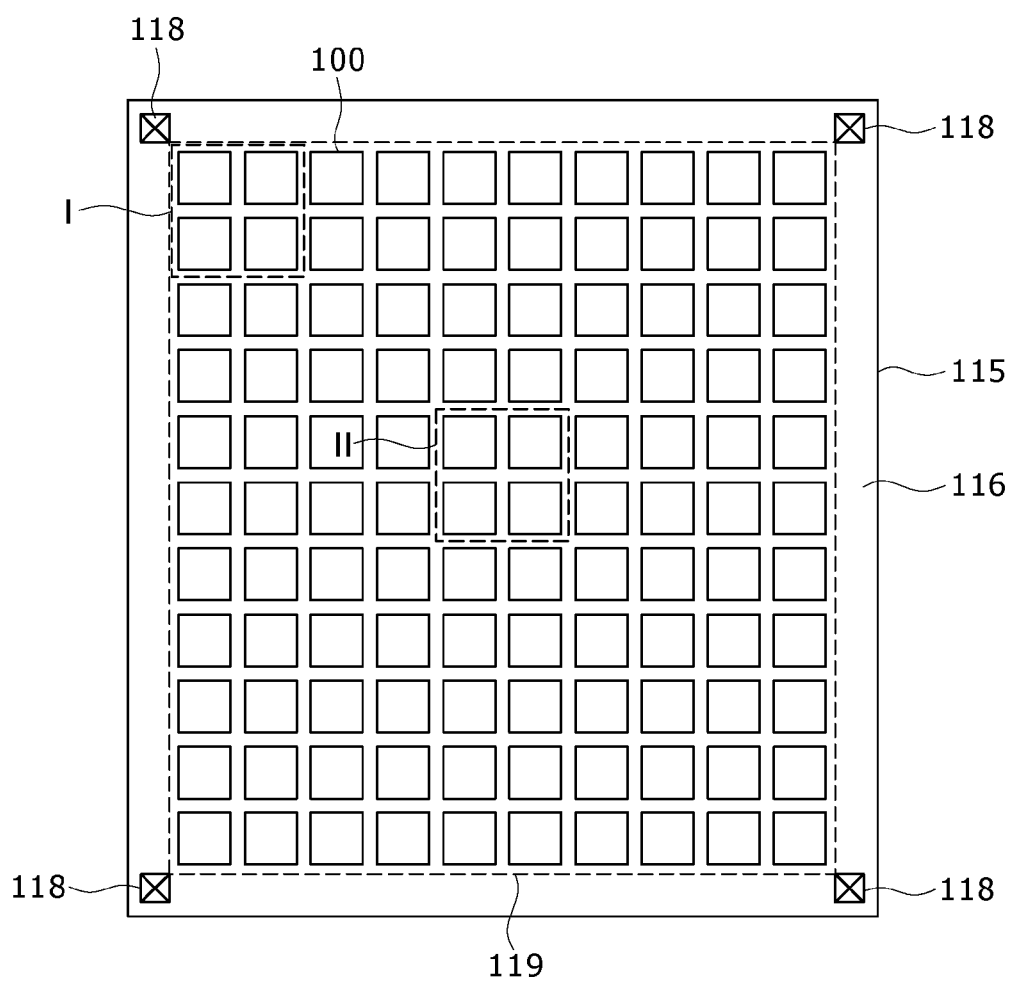
FIG. 20 is a top plan view showing a layout of a main portion of the solid-state image pickup device according to the related art.

Next, an electronic apparatus according to a fourth embodiment of the present invention will be described with reference to FIG. 16. FIG. 16 is a block diagram showing a schematic configuration of an electronic apparatus 200 according to the fourth embodiment of the present invention.

The electronic apparatus 200 of the fourth embodiment corresponds to the case where the image pickup device 1 according to the first embodiment of the present invention described above is used in the electronic apparatus (camera).

The electronic apparatus 200 of the fourth embodiment has the image pickup device 1, an optical lens 210, a shutter arrangement 211, a driving circuit 212, and a signal processing circuit 213.

The optical lens 210 forms an image light (incident light) from a subject as an image on an imaging area of the image pickup device 1. As a result, the signal electric charges concerned are accumulated in the image pickup device 1 for a given period of time.

The shutter arrangement 211 controls both a light radiation period of time and a light blocking period of time to the CMOS type image pickup device 1.

The driving circuit 212 supplies a drive signal in accordance with which an operation for transferring a signal to the CMOS type image pickup device 1, and a shutter operation of the shutter arrangement 211 are controlled. The signal is transferred to the image pickup device 1 in accordance with the drive signal (timing signal) supplied from the driving circuit 212. The signal processing circuit 213 executes various kinds of signal processing. A video signal which is obtained through execution of the signal processing is either stored in a storage medium such as a memory, or outputted to a monitor.

Since in the electronic apparatus 200 of the fourth embodiment, the pixel characteristics such as the amount of saturated signal, and the random noise are improved in the solid-state image pickup device 1, it is possible to obtain the electronic apparatus 200 in which the image quality is enhanced.

The electronic apparatus 200 to which the solid-state image pickup device 1 can be applied is by no means limited to the camera. That is to say, the present invention can also be applied to an image pickup apparatus such as a digital still camera, a monitoring camera, or a camera module for a mobile apparatus such as a mobile phone.

Although in the fourth embodiment, the solid-state image pickup device 1 is used in the electronic apparatus 200, the solid-state image pickup device manufactured in any of the manufacturing methods in the second and third embodiments described above can also be used in the electronic apparatus.

The present application contains subject matter related to that disclosed in Japanese Priority Patent Application JP 2009-285351 filed in the Japan Patent Office on Dec. 16, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state image pickup device, comprising:
   a plurality of pixels each composed of a photoelectric conversion element formed in a semiconductor substrate for generating and accumulating signal electric charges corresponding to a light quantity of incident light, and an electric charge reading portion formed on a front surface side of said semiconductor substrate for reading out the signal electric charges generated and accumulated in said photoelectric conversion element;
   a wiring for a substrate potential formed on a back surface side, of said semiconductor substrate for supplying a desired voltage to said semiconductor substrate, the back surface side being a light receiving surface; and
   a back surface side contact portion through which said wiring for a substrate potential and said semiconductor substrate are electrically connected to each other.

2. The solid-state image pickup device according to claim 1, further comprising:
   a back surface side electrode pad connected to said wiring for a substrate potential on the back surface side of said semiconductor substrate; and
   an opening portion through which said back surface side electrode pad is exposed to the light receiving surface on an upper portion of said back surface side electrode pad.

3. The solid-state image pickup device according to claim 1, further comprising:
   a multilayer wiring layer composed of a plurality of wirings formed on the front surface side of said semiconductor substrate through a front surface side interlayer insulating film; and
   a front surface side contact portion through which the desired one(s) of said multilayer wiring layer, and said semiconductor substrate are electrically connected to each other;
   wherein,
   a desired voltage is supplied from the wiring of said multilayer wiring layer to said wiring for a substrate potential through said front surface side contact portion, said semiconductor substrate, and said back surface side contact portion.

4. The solid-state image pickup device according to claim 1, wherein said back surface side contact portion is formed for every pixel on at least a one-by one basis.

5. The solid-state image pickup device according to claim 1, wherein said back surface contact portion is shared among the plurality of pixels.

6. The solid-state image pickup device according to claim 1, wherein said back surface side contact portion is formed between the adjacent pixels.

7. The solid-state image pickup device according to claim 1, wherein said back surface side contact portion is formed so as to surround a circumference of said photoelectric conversion element.

8. The solid-state image pickup device according to claim 1, wherein said wiring for a substrate potential is composed of a light blocking film for light-blocking a boundary between the adjacent pixels.

9. The solid-state image pickup device according to claim 1, wherein the pixel is structured so as to be either of a metal oxide semiconductor type or of a charge coupled device type.

10. A method of manufacturing a solid-state image pickup device, comprising the steps of:
forming a plurality of pixels each composed of a photoelectric conversion element formed in a semiconductor substrate for generating and accumulating signal electric charges corresponding to a light quantity of incident light, and an electric charge reading portion formed on a front surface side of said semiconductor substrate for reading out the signal electric charges generated and accumulated in said photoelectric conversion element;
forming a back surface side interlayer insulating film on a back surface side of said semiconductor substrate, said back surface side being a light receiving surface;
forming a contact hole in said back surface side interlayer insulating film, and forming a back surface side contact portion by filling a desired metallic material in said contact hole; and
forming a metallic film over an upper portion of said back surface side interlayer insulating film including said back surface side contact portion, and forming a wiring for a substrate potential electrically connected to said semiconductor substrate by patterning said metallic film into a desired shape, a desired voltage being applied to said semiconductor substrate through said wiring for a substrate potential.

11. The method of manufacturing a solid-state image pickup device according to claim 10, wherein the step of filling said metallic material in said contact hole, and the step of forming said metallic film over said upper portion of said back surface side interlayer insulating film including said back surface side contact portion are carried out at the same time.

12. The method of manufacturing a solid-state image pickup device according to claim 10, wherein said wiring for a substrate potential is formed between the adjacent pixels, and is made a light blocking film for light-blocking a boundary between the adjacent pixels.

13. The method of manufacturing a solid-state image pickup device according to claim 10, wherein a back surface side electrode pad is formed so as to be connected to said wiring for a substrate potential, and an opening portion is formed so as for said back surface side electrode pad to be exposed to the light receiving surface side.

14. The method of manufacturing a solid-state image pickup device according to claim 10, further comprising the steps of:
forming a plurality of wirings on the front surface side of said semiconductor substrate through a front surface side interlayer insulating film, thereby forming a multilayer wiring layer; and
forming a front surface side contact portion through which a desired wiring(s) of said multilayer wiring layer and said semiconductor substrate are electrically connected to each other.

15. An electronic apparatus, comprising:
(a) an optical lens;
(b) a solid-state image pickup device to which a light condensed by said optical lens is made incident, said solid-state image pickup device including
  (1) a plurality of pixels each composed of a photoelectric conversion element formed in a semiconductor substrate for generating and accumulating signal electric charges corresponding to a light quantity of incident light, and an electric charge reading portion formed on a front surface side of said semiconductor substrate for reading out the signal electric charges generated and accumulated in said photoelectric conversion element,
  (2) a wiring for a substrate potential formed on a back surface side of said semiconductor substrate for supplying a desired voltage to said semiconductor substrate, the back surface side being a light receiving surface, and
  (3) a back surface side contact portion through which said wiring for a substrate potential and said semiconductor substrate are electrically connected to each other; and
(c) a signal processing circuit for processing an output signal from said solid-state image pickup device.

* * * * *